US009727031B2

(12) United States Patent
Lisseman et al.

(10) Patent No.: US 9,727,031 B2
(45) Date of Patent: Aug. 8, 2017

(54) PRESSURE SENSOR INCLUDING A PRESSURE SENSITIVE MATERIAL FOR USE WITH CONTROL SYSTEMS AND METHODS OF USING THE SAME

(71) Applicant: TK Holdings Inc., Auburn Hills, MI (US)

(72) Inventors: Jason Lisseman, Shelby Township, MI (US); David Andrews, Ortonville, MI (US); Dwayne Van'tZelfde, Holly, MI (US)

(73) Assignee: TK Holdings Inc., Auburn Hills, MI (US)

( * ) Notice: Subject to any disclaimer, the term of this patent is extended or adjusted under 35 U.S.C. 154(b) by 696 days.

(21) Appl. No.: 13/863,363

(22) Filed: Apr. 15, 2013

(65) Prior Publication Data
US 2013/0338847 A1 Dec. 19, 2013

Related U.S. Application Data

(60) Provisional application No. 61/623,791, filed on Apr. 13, 2012.

(51) Int. Cl.
G05B 11/01 (2006.01)
H03K 17/96 (2006.01)
(Continued)

(52) U.S. Cl.
CPC .............. G05B 11/01 (2013.01); G06F 3/045 (2013.01); G06F 3/0414 (2013.01); H03K 17/9625 (2013.01)

(58) Field of Classification Search
None
See application file for complete search history.

(56) References Cited

U.S. PATENT DOCUMENTS 4,268,815 A 5/1981 Eventoff et al.
4,276,538 A 6/1981 Eventoff et al.
(Continued)

FOREIGN PATENT DOCUMENTS

DE 60011078 6/2005
DE 60210951 1/2007
(Continued)

OTHER PUBLICATIONS

International Search Report and Written Opinion, dated Jun. 21, 2013, in connection with corresponding International Application No. PCT/US2013/030417.
(Continued)

Primary Examiner — Mohammad Ali
Assistant Examiner — Saad M Kabir
(74) Attorney, Agent, or Firm — Meunier Carlin & Curfman LLC

(57) ABSTRACT

Various embodiments of pressure sensors send a plurality of control messages to a system controller. An example pressure sensor may include: a base; at least first and second conductors; a pressure sensitive material at least partially intervening between the first and second conductors; a memory; a clock; and a processor. The pressure sensitive material may have a composition configured to continuously change at least one electrical property. The processor may be configured to determine a first electrical property using the first and second conductors, associate the first electrical property with a time from the clock and write the first electrical property and the time to the memory. The processor may also be configured to calculate a time-based change in the first electrical property, correlate the time-based change with at least one of the control messages and communicate the at least one of the control messages to the system controller.

35 Claims, 25 Drawing Sheets

(51) Int. Cl.
*G06F 3/045* (2006.01)
*G06F 3/041* (2006.01)

(56) References Cited

U.S. PATENT DOCUMENTS

| | | |
|---|---|---|
| 4,301,337 A | 11/1981 | Eventoff |
| 4,314,227 A | 2/1982 | Eventoff |
| 4,314,228 A | 2/1982 | Eventoff |
| 4,315,238 A | 2/1982 | Eventoff |
| 4,451,714 A | 5/1984 | Eventoff |
| 4,484,026 A | 11/1984 | Thornburg |
| 4,489,302 A | 12/1984 | Eventoff |
| 4,540,979 A | 9/1985 | Gerger et al. |
| 4,739,299 A | 4/1988 | Eventoff et al. |
| 4,801,771 A | 1/1989 | Mizuguchi et al. |
| 4,810,992 A | 3/1989 | Eventoff |
| 4,929,934 A | 5/1990 | Ueda et al. |
| 4,963,702 A | 10/1990 | Yaniger et al. |
| 5,053,585 A | 10/1991 | Yaniger |
| 5,159,159 A | 10/1992 | Asher |
| 5,186,055 A | 2/1993 | Kovacich et al. |
| 5,209,967 A | 5/1993 | Wright et al. |
| 5,262,778 A | 11/1993 | Saunders |
| 5,296,837 A | 3/1994 | Yaniger |
| 5,302,936 A | 4/1994 | Yaniger |
| 5,365,671 A | 11/1994 | Yaniger |
| 5,398,962 A | 3/1995 | Kropp |
| 5,408,873 A | 4/1995 | Schmidt et al. |
| 5,423,569 A | 6/1995 | Reighard et al. |
| 5,453,941 A | 9/1995 | Yoshikawa |
| 5,463,258 A | 10/1995 | Filion et al. |
| 5,510,783 A | 4/1996 | Findlater et al. |
| 5,539,259 A | 7/1996 | Filion et al. |
| 5,659,334 A | 8/1997 | Yaniger et al. |
| 5,670,988 A | 9/1997 | Tickle |
| 5,793,297 A | 8/1998 | Takeuchi et al. |
| 5,828,363 A | 10/1998 | Yaniger et al. |
| 5,847,639 A | 12/1998 | Yaniger |
| 5,854,625 A | 12/1998 | Frisch et al. |
| 5,871,063 A | 2/1999 | Young |
| 5,907,419 A | 5/1999 | Martnelli et al. |
| 5,914,658 A | 6/1999 | Arakawa |
| 5,943,044 A | 8/1999 | Martinelli et al. |
| 5,965,952 A | 10/1999 | Podoloff et al. |
| 5,982,519 A | 11/1999 | Martnelli et al. |
| 6,084,572 A | 7/2000 | Yaniger |
| 6,239,790 B1 | 5/2001 | Martinelli et al. |
| 6,291,568 B1 | 9/2001 | Lussey |
| 6,333,736 B1 | 12/2001 | Sandbach |
| 6,378,384 B1 | 4/2002 | Atkinson et al. |
| 6,388,556 B1 | 5/2002 | Imai et al. |
| 6,396,523 B1 | 5/2002 | Segal et al. |
| 6,429,846 B2 | 8/2002 | Rosenberg et al. |
| 6,437,682 B1 | 8/2002 | Vance |
| 6,495,069 B1 | 12/2002 | Lussey et al. |
| 6,501,463 B1 | 12/2002 | Dahley et al. |
| 6,529,122 B1 | 3/2003 | Magnussen et al. |
| 6,531,951 B2 | 3/2003 | Serban et al. |
| 6,538,643 B2 | 3/2003 | Mori et al. |
| 6,563,415 B2 | 5/2003 | Armstrong |
| 6,646,540 B1 | 11/2003 | Lussey |
| 6,690,365 B2 | 2/2004 | Hinckley et al. |
| 6,750,803 B2 | 6/2004 | Yates et al. |
| 6,758,689 B1 | 7/2004 | Bair et al. |
| 6,765,557 B1 | 7/2004 | Segal et al. |
| 6,791,532 B2 | 9/2004 | Hirano et al. |
| 6,801,191 B2 | 10/2004 | Mukai et al. |
| 6,809,280 B2 | 10/2004 | Divigalpitiya et al. |
| 6,809,462 B2 | 10/2004 | Pelrine et al. |
| 6,820,804 B2 | 11/2004 | Segal et al. |
| 6,822,640 B2 | 11/2004 | Derocher |
| 6,850,221 B1 | 2/2005 | Tickle |
| 6,861,961 B2 | 3/2005 | Sandbach et al. |
| 6,875,938 B2 | 4/2005 | Schmiz et al. |
| 6,888,537 B2 | 5/2005 | Benson et al. |
| 6,906,700 B1 | 6/2005 | Armstrong |
| 6,909,354 B2 | 6/2005 | Baker et al. |
| 6,947,031 B2 | 9/2005 | Sandbach et al. |
| 6,995,752 B2 | 2/2006 | Lu |
| 7,050,045 B2 | 5/2006 | Baker et al. |
| 7,084,859 B1 | 8/2006 | Pryor |
| 7,091,436 B2 | 8/2006 | Serban |
| 7,091,998 B2 | 8/2006 | Miller-Smith |
| 7,112,755 B2 | 9/2006 | Kitano et al. |
| 7,113,179 B2 | 9/2006 | Baker et al. |
| 7,126,583 B1 | 10/2006 | Breed |
| 7,154,484 B2 | 12/2006 | Komata |
| 7,158,122 B2 | 1/2007 | Roberts |
| 7,161,460 B2 | 1/2007 | Federspiel |
| 7,170,428 B2 | 1/2007 | Himberg et al. |
| 7,176,889 B2 | 2/2007 | Baker et al. |
| 7,190,348 B2 | 3/2007 | Kennedy et al. |
| 7,213,323 B2 | 5/2007 | Baker et al. |
| 7,215,330 B2 | 5/2007 | Rantet |
| 7,250,940 B2 | 7/2007 | Jayanetti et al. |
| 7,258,026 B2 | 8/2007 | Papakostas et al. |
| 7,295,904 B2 | 11/2007 | Kanevsky et al. |
| 7,301,435 B2 | 11/2007 | Lussey et al. |
| 7,310,089 B2 | 12/2007 | Baker et al. |
| 7,324,095 B2 | 1/2008 | Sharma |
| 7,336,260 B2 | 2/2008 | Martin et al. |
| 7,345,675 B1 | 3/2008 | Minakuchi |
| 7,356,769 B2 | 4/2008 | Lehtonen |
| 7,377,133 B2 | 5/2008 | Sandbach et al. |
| 7,388,571 B2 | 6/2008 | Lowles et al. |
| 7,432,459 B2 | 10/2008 | Stoschek et al. |
| 7,468,199 B2 | 12/2008 | Divigalpitiya et al. |
| 7,511,702 B2 | 3/2009 | Hotelling |
| 7,554,045 B2 | 6/2009 | Sandbach et al. |
| 7,554,051 B2 | 6/2009 | Crispin |
| 7,554,531 B2 | 6/2009 | Baker et al. |
| 7,573,464 B2 | 8/2009 | Baker et al. |
| 7,576,294 B2 | 8/2009 | Clemens et al. |
| 7,603,917 B2 | 10/2009 | Graham et al. |
| 7,614,008 B2 | 11/2009 | Ording |
| 7,619,616 B2 | 11/2009 | Rimas-Ribikauskas et al. |
| 7,629,966 B2 | 12/2009 | Anson |
| 7,649,278 B2 | 1/2010 | Yoshida et al. |
| 7,683,889 B2 | 3/2010 | Rimas-Ribikauskas et al. |
| 7,683,890 B2 | 3/2010 | Geaghan |
| 7,693,631 B2 | 4/2010 | Yukawa et al. |
| 7,721,609 B2 | 5/2010 | Wright |
| 7,724,242 B2 | 5/2010 | Hillis et al. |
| 7,733,209 B2 | 6/2010 | Kurtz |
| 7,746,327 B2 | 6/2010 | Miyakoshi |
| 7,772,960 B2 | 8/2010 | Baker |
| 7,773,075 B2 | 8/2010 | Otsuka et al. |
| 7,777,730 B2 | 8/2010 | Geurts et al. |
| 7,791,596 B2 | 9/2010 | Errico et al. |
| 7,808,488 B2 | 10/2010 | Martin et al. |
| 7,813,774 B2 | 10/2010 | Perez-Noguera |
| 7,822,443 B2 | 10/2010 | Kim et al. |
| 7,863,822 B2 | 1/2011 | Stoschek et al. |
| 7,898,381 B2 | 3/2011 | Hatsuda |
| 7,903,090 B2 | 3/2011 | Soss et al. |
| 7,952,566 B2 | 5/2011 | Poupyrev et al. |
| 7,973,773 B2 | 7/2011 | Pryor |
| 8,022,933 B2 | 9/2011 | Hardacker et al. |
| 8,026,902 B2 | 9/2011 | Medler et al. |
| 8,026,906 B2 | 9/2011 | Mölne |
| 8,035,535 B2 | 10/2011 | Nousiainen |
| 8,037,770 B2 | 10/2011 | Larson et al. |
| 8,049,730 B2 | 11/2011 | Joguet et al. |
| 8,049,731 B2 | 11/2011 | Baker et al. |
| 8,049,737 B2 | 11/2011 | Cho et al. |
| 8,052,293 B2 | 11/2011 | Hurwitz |
| 8,059,104 B2 | 11/2011 | Shahoian et al. |
| 8,063,322 B2 | 11/2011 | Katsurahira |
| 8,063,886 B2 | 11/2011 | Serban et al. |
| 8,072,439 B2 | 12/2011 | Hillis et al. |
| 8,072,440 B2 | 12/2011 | Pryor |
| 8,081,165 B2 | 12/2011 | Reiner |
| 8,094,130 B2 | 1/2012 | Griffin et al. |
| 8,095,278 B2 | 1/2012 | Schaaf et al. |

(56) References Cited

U.S. PATENT DOCUMENTS

| | | |
|---|---|---|
| 8,098,236 B2 | 1/2012 | Klein et al. |
| 8,113,065 B2 | 2/2012 | Ohsato et al. |
| 8,120,586 B2 | 2/2012 | Hsu et al. |
| 8,120,588 B2 | 2/2012 | Klinghult |
| 8,130,207 B2 | 3/2012 | Nurmi et al. |
| 8,134,535 B2 | 3/2012 | Choi et al. |
| 8,139,038 B2 | 3/2012 | Chueh et al. |
| 8,144,133 B2 | 3/2012 | Wang et al. |
| 8,149,211 B2 | 4/2012 | Hayakawa et al. |
| 8,151,210 B2 | 4/2012 | Nezu et al. |
| 8,154,528 B2 | 4/2012 | Chen et al. |
| 8,159,473 B2 | 4/2012 | Cheng et al. |
| 8,169,295 B2 | 5/2012 | Walkington |
| 8,171,431 B2 | 5/2012 | Grossman et al. |
| 8,184,093 B2 | 5/2012 | Tsuiki |
| 8,184,106 B2 | 5/2012 | Serban |
| 8,188,985 B2 | 5/2012 | Hillis et al. |
| 8,199,116 B2 | 6/2012 | Jeon et al. |
| 8,203,454 B2 | 6/2012 | Knight et al. |
| 8,212,790 B2 | 7/2012 | Rimas-Ribikauskas et al. |
| 8,214,105 B2 | 7/2012 | Daly et al. |
| 8,222,799 B2 | 7/2012 | Polyakov et al. |
| 8,228,305 B2 | 7/2012 | Pryor |
| 8,229,603 B2 | 7/2012 | Miyata et al. |
| 8,237,324 B2 | 8/2012 | Pei et al. |
| 8,237,537 B2 | 8/2012 | Kurtz |
| 8,239,784 B2 | 8/2012 | Hotelling et al. |
| 8,243,035 B2 | 8/2012 | Abe et al. |
| 8,243,039 B2 | 8/2012 | Trachte |
| 8,253,699 B2 | 8/2012 | Son |
| 8,269,731 B2 | 9/2012 | Molne |
| 8,368,505 B2 | 2/2013 | Deppiesse et al. |
| 8,698,764 B1 | 4/2014 | Karakotsios et al. |
| 9,030,419 B1 | 5/2015 | Freed |
| 2001/0040551 A1 | 11/2001 | Yates et al. |
| 2002/0041164 A1 | 4/2002 | Kim |
| 2002/0054060 A1 | 5/2002 | Schena |
| 2002/0097229 A1 | 7/2002 | Rose et al. |
| 2002/0135457 A1 | 9/2002 | Sandbach et al. |
| 2003/0011576 A1 | 1/2003 | Sandbach et al. |
| 2003/0043014 A1 | 3/2003 | Nakazawa et al. |
| 2003/0076968 A1 | 4/2003 | Rast |
| 2003/0083131 A1 | 5/2003 | Armstrong |
| 2003/0160808 A1 | 8/2003 | Foote et al. |
| 2004/0071471 A1 | 4/2004 | Baker et al. |
| 2004/0207605 A1 | 10/2004 | Mackey et al. |
| 2004/0217331 A1 | 11/2004 | Lussey et al. |
| 2004/0252007 A1 | 12/2004 | Lussey et al. |
| 2005/0052426 A1 | 3/2005 | Hagermoser et al. |
| 2005/0052427 A1 | 3/2005 | Wu et al. |
| 2005/0067889 A1 | 3/2005 | Chernoff |
| 2005/0110769 A1 | 5/2005 | DaCosta et al. |
| 2005/0156705 A1 | 7/2005 | Baker et al. |
| 2005/0273218 A1 | 12/2005 | Breed et al. |
| 2006/0025897 A1 | 2/2006 | Shostak et al. |
| 2006/0028454 A1 | 2/2006 | Branton et al. |
| 2006/0054479 A1 | 3/2006 | Iisaka |
| 2006/0113880 A1 | 6/2006 | Pei et al. |
| 2006/0177212 A1 | 8/2006 | Lamborghini et al. |
| 2006/0202954 A1 | 9/2006 | Ho |
| 2006/0248478 A1 | 11/2006 | Liau |
| 2006/0255903 A1 | 11/2006 | Lussey et al. |
| 2007/0056493 A1 | 3/2007 | Burkitt et al. |
| 2007/0062753 A1 | 3/2007 | Yoshida et al. |
| 2007/0100523 A1 | 5/2007 | Trachte |
| 2007/0132736 A1 | 6/2007 | Crispin |
| 2007/0141939 A1 | 6/2007 | Sandbach et al. |
| 2007/0146313 A1 | 6/2007 | Newman et al. |
| 2007/0146342 A1 | 6/2007 | Medler et al. |
| 2007/0152959 A1 | 7/2007 | Peters |
| 2007/0176902 A1 | 8/2007 | Newman et al. |
| 2007/0229478 A1 | 10/2007 | Rosenberg et al. |
| 2007/0289859 A1 | 12/2007 | Sandbach et al. |
| 2008/0024438 A1 | 1/2008 | Collins et al. |
| 2008/0024454 A1 | 1/2008 | Everest |
| 2008/0030479 A1 | 2/2008 | Lowles et al. |
| 2008/0030482 A1 | 2/2008 | Elwell et al. |
| 2008/0036743 A1 | 2/2008 | Westerman et al. |
| 2008/0060854 A1 | 3/2008 | Perlin |
| 2008/0062145 A1 | 3/2008 | Shahoian et al. |
| 2008/0079604 A1 | 4/2008 | Madonna et al. |
| 2008/0088577 A1 | 4/2008 | Lenneman et al. |
| 2008/0088600 A1 | 4/2008 | Prest et al. |
| 2008/0094367 A1 | 4/2008 | Van De Ven et al. |
| 2008/0130126 A1 | 6/2008 | Brooks et al. |
| 2008/0170043 A1 | 7/2008 | Soss et al. |
| 2008/0202912 A1 | 8/2008 | Boddie et al. |
| 2008/0211766 A1 | 9/2008 | Westerman et al. |
| 2008/0230283 A1 | 9/2008 | Yoon et al. |
| 2008/0264183 A1 | 10/2008 | Graham et al. |
| 2008/0271933 A1 | 11/2008 | Morimoto |
| 2008/0278455 A1 | 11/2008 | Atkins et al. |
| 2008/0284743 A1 | 11/2008 | Hsu et al. |
| 2008/0289886 A1 | 11/2008 | Burkitt |
| 2008/0296073 A1 | 12/2008 | McDermid |
| 2008/0296140 A1 | 12/2008 | Yoshihara et al. |
| 2008/0302014 A1 | 12/2008 | Szczerba et al. |
| 2008/0303799 A1 | 12/2008 | Schwesig et al. |
| 2008/0303802 A1 | 12/2008 | Destura et al. |
| 2008/0309624 A1 | 12/2008 | Hotelling |
| 2008/0309626 A1 | 12/2008 | Westerman et al. |
| 2008/0316181 A1 | 12/2008 | Nurmi |
| 2009/0002325 A1 | 1/2009 | Jha et al. |
| 2009/0009482 A1 | 1/2009 | McDermid |
| 2009/0020343 A1 | 1/2009 | Rothkopf et al. |
| 2009/0027353 A1 | 1/2009 | Im et al. |
| 2009/0061823 A1 | 3/2009 | Chu |
| 2009/0087655 A1 | 4/2009 | Yamada et al. |
| 2009/0095541 A1 | 4/2009 | Lee |
| 2009/0128507 A1 | 5/2009 | Hoshino et al. |
| 2009/0140985 A1 | 6/2009 | Liu |
| 2009/0140989 A1 | 6/2009 | Ahlgren |
| 2009/0140994 A1 | 6/2009 | Tanaka et al. |
| 2009/0140996 A1 | 6/2009 | Takashima et al. |
| 2009/0151447 A1 | 6/2009 | Jin et al. |
| 2009/0153522 A1 | 6/2009 | Chou |
| 2009/0160529 A1 | 6/2009 | Lamborghini |
| 2009/0160793 A1 | 6/2009 | Rekimoto |
| 2009/0167722 A1 | 7/2009 | Villain |
| 2009/0174674 A1 | 7/2009 | Forutanpour |
| 2009/0184921 A1 | 7/2009 | Scott et al. |
| 2009/0201261 A1 | 8/2009 | Day |
| 2009/0237374 A1 | 9/2009 | Li et al. |
| 2009/0241378 A1 | 10/2009 | Ellis |
| 2009/0244017 A1 | 10/2009 | Pala et al. |
| 2009/0249191 A1 | 10/2009 | Leoutsarakos et al. |
| 2009/0256807 A1 | 10/2009 | Nurmi |
| 2009/0256817 A1 | 10/2009 | Perlin et al. |
| 2009/0258677 A1 | 10/2009 | Ellis et al. |
| 2009/0265670 A1 | 10/2009 | Kim et al. |
| 2009/0267921 A1 | 10/2009 | Pryor |
| 2009/0273573 A1 | 11/2009 | Hotelling |
| 2009/0279811 A1 | 11/2009 | Kilburn et al. |
| 2009/0309616 A1 | 12/2009 | Klinghult et al. |
| 2009/0322695 A1 | 12/2009 | Cho et al. |
| 2009/0327977 A1 | 12/2009 | Bachfischer et al. |
| 2010/0013774 A1 | 1/2010 | Chen et al. |
| 2010/0020030 A1 | 1/2010 | Kim et al. |
| 2010/0024573 A1 | 2/2010 | Daverman et al. |
| 2010/0026640 A1 | 2/2010 | Kim et al. |
| 2010/0039393 A1 | 2/2010 | Pratt et al. |
| 2010/0045612 A1 | 2/2010 | Molne |
| 2010/0045624 A1 | 2/2010 | Hisatsugu et al. |
| 2010/0053078 A1 | 3/2010 | Kim et al. |
| 2010/0053116 A1 | 3/2010 | Daverman et al. |
| 2010/0062148 A1 | 3/2010 | Lussey et al. |
| 2010/0066697 A1 | 3/2010 | Jacomet et al. |
| 2010/0079391 A1 | 4/2010 | Joung |
| 2010/0079395 A1 | 4/2010 | Kim et al. |
| 2010/0085169 A1 | 4/2010 | Poupyrev et al. |
| 2010/0090973 A1 | 4/2010 | Algreatly |
| 2010/0097335 A1 | 4/2010 | Jung et al. |
| 2010/0097336 A1 | 4/2010 | Gomes et al. |
| 2010/0099394 A1 | 4/2010 | Hainzl |

(56) References Cited

U.S. PATENT DOCUMENTS

| | | |
|---|---|---|
| 2010/0102922 A1 | 4/2010 | Walkington |
| 2010/0110018 A1 | 5/2010 | Faubert et al. |
| 2010/0110026 A1 | 5/2010 | Kis et al. |
| 2010/0117978 A1 | 5/2010 | Shirado |
| 2010/0123667 A1 | 5/2010 | Kim et al. |
| 2010/0123678 A1 | 5/2010 | Kim et al. |
| 2010/0123686 A1 | 5/2010 | Klinghult et al. |
| 2010/0126840 A1 | 5/2010 | Walkington |
| 2010/0127975 A1 | 5/2010 | Jensen |
| 2010/0127983 A1 | 5/2010 | Irani et al. |
| 2010/0141410 A1 | 6/2010 | Aono et al. |
| 2010/0153879 A1 | 6/2010 | Rimas-Ribikauskas et al. |
| 2010/0156818 A1 | 6/2010 | Burrough et al. |
| 2010/0168998 A1 | 7/2010 | Matsunaga |
| 2010/0171713 A1 | 7/2010 | Kwok et al. |
| 2010/0214239 A1 | 8/2010 | Wu |
| 2010/0222972 A1 | 9/2010 | Hustyi |
| 2010/0231540 A1 | 9/2010 | Cruz-Hernandez et al. |
| 2010/0250071 A1 | 9/2010 | Pala et al. |
| 2010/0253645 A1 | 10/2010 | Bolender |
| 2010/0265170 A1 | 10/2010 | Norieda |
| 2010/0271325 A1 | 10/2010 | Conte et al. |
| 2010/0277438 A1 | 11/2010 | Kawashima et al. |
| 2010/0283749 A1 | 11/2010 | Walkington |
| 2010/0308844 A1 | 12/2010 | Day et al. |
| 2010/0315267 A1 | 12/2010 | Chung et al. |
| 2010/0315349 A1 | 12/2010 | Choi |
| 2010/0321310 A1 | 12/2010 | Kim et al. |
| 2011/0006980 A1 | 1/2011 | Taniguchi et al. |
| 2011/0007023 A1 | 1/2011 | Abrahamsson et al. |
| 2011/0021251 A1 | 1/2011 | Lindén |
| 2011/0022393 A1 | 1/2011 | Wäller et al. |
| 2011/0030502 A1 | 2/2011 | Lathrop |
| 2011/0032203 A1 | 2/2011 | Pryor |
| 2011/0037721 A1 | 2/2011 | Cranfill et al. |
| 2011/0043468 A1 | 2/2011 | Lathrop et al. |
| 2011/0043491 A1 | 2/2011 | Oh |
| 2011/0046788 A1 | 2/2011 | Daly et al. |
| 2011/0050588 A1 | 3/2011 | Li et al. |
| 2011/0050589 A1 | 3/2011 | Yan et al. |
| 2011/0050591 A1 | 3/2011 | Kim et al. |
| 2011/0050629 A1 | 3/2011 | Homma et al. |
| 2011/0054359 A1 | 3/2011 | Sazonov et al. |
| 2011/0057899 A1 | 3/2011 | Sleeman et al. |
| 2011/0063248 A1 | 3/2011 | Yoon |
| 2011/0069024 A1 | 3/2011 | Kim |
| 2011/0074724 A1 | 3/2011 | Pryor |
| 2011/0082627 A1 | 4/2011 | Small et al. |
| 2011/0087983 A1 | 4/2011 | Shim |
| 2011/0107272 A1 | 5/2011 | Aguilar |
| 2011/0109578 A1 | 5/2011 | Wäller et al. |
| 2011/0115736 A1 | 5/2011 | Joguet et al. |
| 2011/0128164 A1 | 6/2011 | Kang et al. |
| 2011/0128235 A1 | 6/2011 | Rogers et al. |
| 2011/0128250 A1 | 6/2011 | Murphy et al. |
| 2011/0141052 A1 | 6/2011 | Bernstein et al. |
| 2011/0141053 A1 | 6/2011 | Bulea et al. |
| 2011/0175754 A1 | 7/2011 | Karpinsky |
| 2011/0175844 A1 | 7/2011 | Berggren |
| 2011/0175845 A1 | 7/2011 | Honda et al. |
| 2011/0181430 A1 | 7/2011 | Hu et al. |
| 2011/0181546 A1 | 7/2011 | Joguet et al. |
| 2011/0187674 A1 | 8/2011 | Baker et al. |
| 2011/0193813 A1 | 8/2011 | Gralewski et al. |
| 2011/0205151 A1 | 8/2011 | Newton et al. |
| 2011/0205162 A1 | 8/2011 | Wäller et al. |
| 2011/0205182 A1 | 8/2011 | Miyazawa et al. |
| 2011/0210926 A1 | 9/2011 | Pasquero et al. |
| 2011/0216015 A1 | 9/2011 | Edwards |
| 2011/0221564 A1 | 9/2011 | Deppiesse et al. |
| 2011/0221684 A1 | 9/2011 | Rydenhag |
| 2011/0221693 A1 | 9/2011 | Miyazaki |
| 2011/0221694 A1 | 9/2011 | Karaoguz et al. |
| 2011/0227870 A1 | 9/2011 | Kim |
| 2011/0227872 A1 | 9/2011 | Huska et al. |
| 2011/0239110 A1 | 9/2011 | Garrett et al. |
| 2011/0241850 A1 | 10/2011 | Bosch et al. |
| 2011/0242029 A1 | 10/2011 | Kasahara et al. |
| 2011/0245992 A1 | 10/2011 | Stahlin et al. |
| 2011/0248728 A1 | 10/2011 | Maruyama |
| 2011/0248942 A1 | 10/2011 | Yana et al. |
| 2011/0248948 A1 | 10/2011 | Griffin et al. |
| 2011/0253948 A1 | 10/2011 | Lussey et al. |
| 2011/0260965 A1 | 10/2011 | Kim et al. |
| 2011/0265002 A1 | 10/2011 | Hong et al. |
| 2011/0267294 A1 | 11/2011 | Kildal |
| 2011/0273394 A1 | 11/2011 | Young et al. |
| 2011/0275412 A1 | 11/2011 | Khawand |
| 2011/0278078 A1 | 11/2011 | Schediwy et al. |
| 2011/0290038 A1 | 12/2011 | Hoshino et al. |
| 2011/0304559 A1 | 12/2011 | Pasquero |
| 2011/0304581 A1 | 12/2011 | An et al. |
| 2011/0316811 A1 | 12/2011 | Kitagawa |
| 2012/0001870 A1 | 1/2012 | Lee et al. |
| 2012/0013573 A1 | 1/2012 | Liu et al. |
| 2012/0019448 A1 | 1/2012 | Pitkanen et al. |
| 2012/0019463 A1 | 1/2012 | Ng et al. |
| 2012/0026124 A1 | 2/2012 | Li et al. |
| 2012/0032899 A1 | 2/2012 | Waeller et al. |
| 2012/0032907 A1 | 2/2012 | Koizumi et al. |
| 2012/0032915 A1 | 2/2012 | Wittorf |
| 2012/0044169 A1 | 2/2012 | Enami |
| 2012/0044172 A1 | 2/2012 | Ohki et al. |
| 2012/0050159 A1 | 3/2012 | Yu et al. |
| 2012/0050208 A1 | 3/2012 | Dietz |
| 2012/0056818 A1 | 3/2012 | Shafi et al. |
| 2012/0056837 A1 | 3/2012 | Park et al. |
| 2012/0062603 A1 | 3/2012 | Mizunuma et al. |
| 2012/0068946 A1 | 3/2012 | Tang et al. |
| 2012/0068965 A1 | 3/2012 | Wada et al. |
| 2012/0068969 A1 | 3/2012 | Bogana et al. |
| 2012/0081327 A1 | 4/2012 | Heubel et al. |
| 2012/0086659 A1 | 4/2012 | Perlin et al. |
| 2012/0086670 A1 | 4/2012 | Teil et al. |
| 2012/0092250 A1 | 4/2012 | Hadas et al. |
| 2012/0092279 A1 | 4/2012 | Martin |
| 2012/0092294 A1 | 4/2012 | Ganapathi et al. |
| 2012/0092299 A1 | 4/2012 | Harada et al. |
| 2012/0092324 A1 | 4/2012 | Buchan et al. |
| 2012/0105358 A1 | 5/2012 | Momeyer et al. |
| 2012/0105367 A1 | 5/2012 | Son et al. |
| 2012/0113028 A1 | 5/2012 | Marsden et al. |
| 2012/0113054 A1 | 5/2012 | Hashimoto et al. |
| 2012/0113061 A1 | 5/2012 | Ikeda |
| 2012/0120009 A1 | 5/2012 | Lussey et al. |
| 2012/0126959 A1 | 5/2012 | Zarrabi et al. |
| 2012/0127088 A1 | 5/2012 | Pance et al. |
| 2012/0127107 A1 | 5/2012 | Miyashita et al. |
| 2012/0127179 A1 | 5/2012 | Aspelin |
| 2012/0139864 A1 | 6/2012 | Sleeman et al. |
| 2012/0146945 A1 | 6/2012 | Miyazawa et al. |
| 2012/0147052 A1 | 6/2012 | Homma et al. |
| 2012/0154315 A1 | 6/2012 | Aono |
| 2012/0154316 A1 | 6/2012 | Kono |
| 2012/0154317 A1 | 6/2012 | Aono |
| 2012/0154318 A1 | 6/2012 | Aono |
| 2012/0154328 A1 | 6/2012 | Kono |
| 2012/0154329 A1 | 6/2012 | Shinozaki |
| 2012/0154330 A1 | 6/2012 | Shimizu |
| 2012/0162122 A1 | 6/2012 | Geaghan |
| 2012/0169609 A1 | 7/2012 | Britton |
| 2012/0169617 A1 | 7/2012 | Mäenpää |
| 2012/0169635 A1 | 7/2012 | Liu |
| 2012/0169636 A1 | 7/2012 | Liu |
| 2012/0188181 A1 | 7/2012 | Ha et al. |
| 2012/0194460 A1 | 8/2012 | Kuwabara et al. |
| 2012/0194466 A1 | 8/2012 | Posamentier |
| 2012/0199921 A1 | 8/2012 | Tanaka et al. |
| 2012/0204653 A1 | 8/2012 | August et al. |
| 2012/0205165 A1 | 8/2012 | Strittmatter et al. |
| 2012/0206393 A1 | 8/2012 | Hillis et al. |
| 2012/0218212 A1 | 8/2012 | Yu et al. |
| 2012/0229424 A1 | 9/2012 | Behles |
| 2012/0235940 A1 | 9/2012 | Ludwig |

(56) References Cited

U.S. PATENT DOCUMENTS

| | | | |
|---|---|---|---|
| 2013/0002538 A1 | 1/2013 | Mooring et al. |
| 2013/0038437 A1 | 2/2013 | Talati et al. |
| 2013/0063389 A1 | 3/2013 | Moore |
| 2013/0113715 A1 | 5/2013 | Grant et al. |
| 2013/0128587 A1 | 5/2013 | Lisseman et al. |
| 2013/0307788 A1 | 11/2013 | Rao et al. |
| 2014/0076063 A1 | 3/2014 | Lisseman et al. |
| 2014/0253504 A1 | 9/2014 | Noshadi et al. |
| 2014/0267113 A1 | 9/2014 | Lisseman et al. |
| 2014/0267114 A1 | 9/2014 | Lisseman et al. |
| 2015/0067513 A1 | 3/2015 | Zambetti et al. |
| 2015/0067596 A1 | 3/2015 | Brown et al. |

FOREIGN PATENT DOCUMENTS

| | | |
|---|---|---|
| DE | 60130983 | 7/2008 |
| EP | 1640697 | 3/2006 |
| EP | 1887595 | 2/2008 |
| GB | 2423646 | 8/2006 |
| GB | 2445505 | 7/2008 |
| GB | 2448893 | 11/2008 |
| GB | 2450587 | 12/2008 |
| GB | 2452714 | 3/2009 |
| GB | 2454619 | 5/2009 |
| GB | 2462920 | 3/2010 |
| GB | 2465077 | 5/2010 |
| GB | 2465713 | 6/2010 |
| GB | 2468870 | 9/2010 |
| GB | 2437997 | 7/2011 |
| GB | 2443658 | 9/2011 |
| JP | 58-141835 | 9/1983 |
| JP | 64-66522 | 3/1989 |
| JP | 06-037056 U | 5/1994 |
| JP | 2005-175815 | 6/2005 |
| JP | 2006-129893 | 5/2006 |
| JP | 2007-076491 | 3/2007 |
| JP | 2008-181709 | 8/2008 |
| JP | 2009-008613 | 1/2009 |
| JP | 2009-521006 | 5/2009 |
| JP | 2009-186452 | 8/2009 |
| JP | 2009-244931 | 10/2009 |
| JP | 2010-511916 | 4/2010 |
| JP | 2012-058159 | 3/2012 |
| KR | 1999-0047429 | 7/1999 |
| KR | 2009-0074571 | 7/2009 |
| KR | 2010-0087721 | 8/2010 |
| KR | 2011-0014115 | 2/2011 |
| KR | 1020110042924 | 4/2011 |
| WO | 99/38173 | 7/1999 |
| WO | 00/79546 | 12/2000 |
| WO | 01/88935 | 11/2001 |
| WO | 02/099822 | 12/2002 |
| WO | 2005/029514 | 3/2005 |
| WO | 2006/016138 | 2/2006 |
| WO | 2006/123616 | 11/2006 |
| WO | 2007/072319 | 6/2007 |
| WO | 2007/107522 | 9/2007 |
| WO | 2008/062403 | 5/2008 |
| WO | 2008/135787 | 11/2008 |
| WO | 2009/034313 | 3/2009 |
| WO | 2010/023449 | 9/2010 |
| WO | 2010/109186 | 9/2010 |
| WO | 2011/045929 | 4/2011 |
| WO | 2012/001428 | 1/2012 |
| WO | 2012/088549 | 6/2012 |

OTHER PUBLICATIONS

International Preliminary Report on Patentability and Written Opinion issued in related International Application No. PCT/US2013/030417 on Oct. 14, 2014.

Knite, M., et al., "Polyisoprene-multi-wall carbon nanotube composites for sensing strain," Materials Science and Engineering C., vol. 37, No. 5, 2006, pp. 1125-1128.

International Preliminary Report on Patentability and Written Opinion, dated May 13, 2014, received in connection with International Patent Application No. PCT/US2012/064409.

International Search Report and Written Opinion, dated Mar. 29, 2013, received in connection with International Patent Application No. PCT/US2012/064409.

International Preliminary Report on Patentability and Written Opinion, dated Sep. 15, 2015, received in connection with International Patent Application No. PCT/US2014/027735.

International Search Report and Written Opinion, dated Jun. 24, 2014, received in connection with International Patent Application No. PCT/US2014/027735.

International Preliminary Report on Patentability and Written Opinion, dated Sep. 15, 2015, received in connection with International Patent Application No. PCT/US2014/027777.

International Search Report and Written Opinion, dated Jun. 26, 2014, received in connection with International Patent Application No. PCT/US2014/027777.

International Preliminary Report on Patentability and Written Opinion, dated Mar. 17, 2015, received in connection with International Patent Application No. PCT/US2013/060046.

International Search Report and Written Opinion, dated Dec. 17, 2013, received in connection with International Patent Application No. PCT/US2013/060046.

Office Action dated Nov. 4, 2014, received in connection with JP Patent Application No. 2011-075258. (English Translation attached).

Office Action dated Sep. 11, 2014 in U.S. Appl. No. 13/076,226, which issued as U.S. Pat. No. 9,007,190 on Apr. 14, 2015.

Office Action dated Feb. 13, 2014 in U.S. Appl. No. 13/076,226, which issued as U.S. Pat. No. 9,007,190 on Apr. 14, 2015.

Office Action dated Mar. 11, 2013 in U.S. Appl. No. 13/076,226, which issued as U.S. Pat. No. 9,007,190 on Apr. 14, 2015.

Office Action dated Jan. 21, 2016 in U.S. Appl. No. 13/673,463.

Advisory Action, dated Nov. 5, 2015 in U.S. Appl. No. 13/673,463.

Office Action dated Aug. 20, 2015 in U.S. Appl. No. 13/673,463.

Office Action dated Feb. 18, 2015 in U.S. Appl. No. 13/673,463.

Office Action dated Dec. 17, 2015 in U.S. Appl. No. 14/211,475.

Office Action dated Dec. 15, 2015 in U.S. Appl. No. 14/211,665.

Office Action dated Oct. 8, 2015, received in U.S. Appl. No. 14/028,798.

Final Office Action dated Apr. 21, 2016 in U.S. Appl. No. 14/028,798.

Final Office Action dated Aug. 16, 2016 in U.S. Appl. No. 14/211,475.

Final Office Action dated Aug. 16, 2016 in U.S. Appl. No. 14/211,665.

Final Office Action dated Aug. 24, 2016 in U.S. Appl. No. 13/673,463.

Office Action, dated Oct. 18, 2016, received in connection with JP Patent Application No. 2014-541319. (English translation attached).

Office Action, dated Jan. 23, 2017, received in connection with U.S. Appl. No. 14/211,475.

Office Action, dated Jan. 23, 2017, received in connection with U.S. Appl. No. 14/211,665.

Office Action, dated Oct. 21, 2016, received in connection with U.S. Appl. No. 14/028,798.

| Gesture | Gesture Timing | Gestures / Min |
| --- | --- | --- |
| Tap | 0.5s Minimum | 120 |
| Hold | 1s Minimum | 60 |
| S1 Full Swipe | 1.2s Minimum | 50 |
| S2 Full Swipe | 0.6s Minimum | 100 |
| S3 Full Swipe | 0.4s Minimum | 150 |

FIG. 7A

| Tap | Swipe | |
| --- | --- | --- |
| P1 | P1 | S1 |
| P2 | P1 | S2 |
| P3 | P1 | S3 |
|  | P2 | S1 |
|  | P2 | S2 |
|  | P2 | S3 |
|  | P3 | S1 |
|  | P3 | S2 |
|  | P3 | S3 |

FIG. 7B

| Tap | Swipe | | Hold |
| --- | --- | --- | --- |
| P1 | P1 | S1 | P1 |
| P2 | P1 | S2 | P2 |
| P3 | P1 | S3 | P3 |
|  | P2 | S1 |  |
|  | P2 | S2 |  |
|  | P2 | S3 |  |
|  | P3 | S1 |  |
|  | P3 | S2 |  |
|  | P3 | S3 |  |

FIG. 7C

| Group | Sub Group | Function |
|---|---|---|
| Media | Audio | Vol+/Vol-/Mute/On/Off |
| | Seek / Track | Track+/Track-/Select/FF/REW/Pause |
| | Media | Select+/Select-/Select/Cancel/On/Off |
| | Phone | Select+/Select-/Select/Call/End Call/On/Off |
| | Message | Select+/Select-/Select/Listen/Delete/On/Off |
| Driving | Cruise Ctrl | Speed+/Speed-/Set/Resume/Cancel/On/Off |
| | Adv Cruise | Dist+/Dist-/Set/Resume/Cancel/On/Off |
| | Speed Ctrl | Speed+/Speed-/Set/Cancel/On/Off |
| Comfort | Fan Speed | Speed+/Speed-/On/Off |
| | Temperature | Temp+/Temp-/Max Temp/Min Temp/Temp Level |
| | HVAC Zone | Windshield/Forward/Floor/Recirc... |
| Visibility | Wipers | Speed+/Speed-/Wash/Off |
| | Rear Wipers | Speed+/Speed-/Off/Wash |
| | Ext.Lighting | Flash/High Beam/Dimmed/Foglights/Exterior/Hazard |
| | Int.Lighting | Light Intensity/On/Off |
| Control | Open Position | Position/Full Open/Full Close/On/Off/Lock |
| | 3-Axis Position | X Axis +/X Axis -/Y Axis +/Y Axis -/Z Axis +/Z Axis - |
| | 2-Axis Position | Axis1 +/Axis1 -/Axis2 +/Axis2 - |
| | Radial Position | Axis1 +/Axis1 -/Axis2 +/Axis2 -/Axis3 +/Axis3 - |

FIG. 8

PRESSURE SENSOR INCLUDING A PRESSURE SENSITIVE MATERIAL FOR USE WITH CONTROL SYSTEMS AND METHODS OF USING THE SAME

CROSS-REFERENCE TO RELATED APPLICATIONS

This application claims the benefit of U.S. Provisional Patent Application No. 61/623,791, filed on Apr. 13, 2012, entitled "Pressure Sensor Including a Pressure Sensitive Material for Use With Control Systems," the disclosure of which is expressly incorporated herein by reference in its entirety.

BACKGROUND

The present disclosure relates generally to the field of sensors, and more particularly to a pressure sensor including a pressure sensitive material.

Conventional control systems present users with a combination of controls such as switches, buttons, levers, knobs, dials, etc. The users interact with these control systems by manipulating the presented controls in order to execute various control functions. Recently, control systems have become increasingly complex due to the growing number of controllable features. As control systems increase in complexity, user control panels become cluttered with switches, buttons, levers, knobs and/or dials. Accordingly, the control systems become more difficult to operate. In addition, it becomes difficult for engineers to design user control panels that are capable of accommodating all of the necessary controls within a confined space.

Pressure sensitive control panels have been developed to address the problems in the related art. Pressure sensitive control panels are capable of sensing a magnitude of an applied force in addition to a location of an applied force. By sensing both the magnitude and location of the applied force, it is possible to provide a larger number of control functions in a simple, user-friendly format. However, pressure sensitive control panels in the related art lack adequate pressure sensitivity and responsiveness.

SUMMARY

Pressure sensors for sending a plurality of control messages to a system controller are disclosed herein. In one example implementation, the pressure sensor may include: a base; at least a first conductor and a second conductor; a pressure sensitive material supported by the base and at least partially intervening between the first and second conductors and having a composition configured to continuously change at least one electrical property; a memory; a clock; and a processor connected in communication with the first and second conductors, the memory and the clock. The processor may be configured to determine a first electrical property of the pressure sensitive material using the first and second conductors and associate the first electrical property with a time from the clock and to write the first electrical property associated with the time to the memory. The processor may be further configured to read the first electrical property and the time from the memory and to calculate a time-based change in the first electrical property. In addition, the processor may be further configured to correlate the time-based change in the first electrical property with at least one of the control messages and to communicate the at least one of the control messages to the system controller.

Optionally, the at least one electrical property may be continuously variable in relation to an amount of applied force within the range of applied force. The at least one electrical property may also be capable of changing substantially instantaneously in response to a change in the amount of applied force. Further, the at least one electrical property may be resistance.

Alternatively or additionally, resistance values of the pressure sensitive material in response to varying amounts of applied force may define a predictable resistance-force response curve. For example, resistance values of the pressure sensitive material may vary between approximately $10^{12}$ and $1\Omega$ between approximately 0 N and 10 N. In addition, a resistance value of the pressure sensitive material may be approximately 5 k$\Omega$ when the amount of applied force is approximately 1 N and a resistance value of the pressure sensitive material may be approximately 1.5 k$\Omega$ when the amount of applied force is approximately 3 N.

In another example implementation, the pressure sensitive material may include a single contiguous layer at least partially intervening between the first and second conductors.

In yet another example implementation, the pressure sensor may include a third conductor, and the pressure sensitive material may at least partially intervene between pairs of the conductors.

Optionally, the processor may be connected in communication with the third conductor and may be configured to determine a second electrical property using the third conductor.

Alternatively or additionally, the processor may be configured to associate the second electrical property with the time from the clock and to write the second electrical property associated with the time to the memory.

In addition, the processor may be further configured to read the second electrical property and the time from the memory and to calculate a time-based change in the second electrical property.

In other implementations, the processor may be further configured to correlate the time-based change in the second electrical property with the at least one of the control messages. For example, the control messages may be stored in the memory and may be each associated with one or more time based changes in the electrical properties.

Optionally, the first and second electrical properties of the pressure sensitive material may be resistances.

In another example implementation, the pressure sensor may include a fourth conductor. In addition, the processor may be connected in communication with the fourth conductor and may be configured to determine the second electrical property using the fourth conductor.

Optionally, the processor may be further configured to determine a position of the amount of pressure on the pressure sensitive material using the first and second electrical property.

Alternatively or additionally, the processor may be further configured to associate the position with the time from the clock and to write the position associated with the time to the memory. In addition, the processor may be configured to read the position and the time from the memory and to calculate a time-based change to the position. Further, the processor may be configured to correlate the time-based change in the position with the at least one of the control messages.

In other implementations, the processor may be configured to determine and write to the memory a series of associated positions, first electrical properties and times to the memory. Optionally, the processor may be configured to determine a path and pressure contour from the series. In addition, the processor may be further configured to determine whether the path and pressure contour meet a swipe threshold. The processor may also be configured to correlate the swipe threshold with the at least one of the control messages.

In another example implementation, the processor may be configured to determine whether the time-based change in the first electrical property exceeds a threshold associated with the amount of pressure.

Alternatively or additionally, the processor may be configured to determine whether a time comparison between the time from the memory and a second time meets a time threshold. Additionally, the processor may be configured to use meeting of the pressure and time thresholds as preconditions to communication of the at least one of the control messages.

In other implementations, the processor may be further configured to correlate meeting of the thresholds with at least one of the control messages. For example, the processor may be further configured to classify the time-based change as a tap if the time comparison is less than the time threshold. Alternatively, the processor may be further configured to classify the time-based change as a hold if the time comparison is more than the time threshold. In addition, the processor may be further configured to correlate whether the time-based change is the tap or the hold with the at least one of the control messages.

In another example implementation, the pressure sensitive material may have a plurality of zones and each of the zones may be connected to a pair of conductors.

Optionally, the processor may be connected to the pairs of conductors and configured to determine the first electrical property of each of the zones using the pairs of conductors.

Alternatively or additionally, the processor may be further configured to associate the first electrical property and to write the first electrical property associated with each of the zones to the memory. The processor may also be configured to read the first electrical property associated with each of the zones from memory and to calculate the time-based change in the first electrical property using the first electrical property associated with each of the zones.

The zones may be defined by separate portions of the pressure sensitive material. For example, at least two of the zones may overlap. Alternatively or additionally, the zones may form a strip, a grid, a radius, etc. Optionally, the zones may be arranged in a spaced array. Optionally, at least some of the zones may form buttons. For example, at least some of the zones may form at least one strip, and the buttons and at least one strip may extend in a U-shaped configuration. In addition, the buttons may form at least one leg of the U-shaped configuration, and the at least one strip may form at least another leg of the U-shaped configuration.

In other implementations, at least some of the zones form at least one grid. In addition, a first array of buttons may be positioned next to the grid. Additionally, a second array of buttons may be positioned next to the grid opposite the first array of buttons. Optionally, two strips may be positioned on opposite sides of the buttons.

In another example implementation, the pressure sensor may include a cover defining portions corresponding to the zones. For example, each of the cover portions may include indicia associated with at least one of the control messages.

Optionally, each of the cover portions and corresponding zones may define a button. Alternatively or additionally, the cover may be coupled to at least one of the base or the pressure sensitive material.

In yet another example implementation, the pressure sensor may include a force concentrator positioned against the pressure sensitive material. Optionally, the pressure sensor may include a cover, and the force concentrator may be positioned between the cover and the pressure sensitive material.

Methods for sensing force using a pressure sensitive material are also disclosed herein. In one example implementation, the method for sending a plurality of control messages to a system controller using a pressure sensitive material that at least partially intervenes between at least first and second conductors can include: receiving a clock signal; determining a first electrical property of the pressure sensitive material using the first and second conductors; associating the first electrical property with a time from the clock signal; writing the first electrical property associated with the time to a memory; reading the first electrical property and the time from the memory; calculating a time-based change in the first electrical property; correlating the time-based change in the first electrical property with at least one of the control messages; and communicating the at least one of the control messages to the system controller. Additionally, the pressure sensitive material can have a composition configured to continuously change at least the first electrical property.

Optionally, the at least one electrical property can be continuously variable in relation to an amount of applied force. The at least one electrical property can also be capable of changing substantially instantaneously in response to a change in the amount of applied force. Further, the at least one electrical property can be resistance.

The resistance values of the pressure sensitive material in response to varying amounts of applied force can define a predictable resistance-force response curve. For example, resistance values of the pressure sensitive material may vary between approximately $10^{12}$ and $1\Omega$ between approximately 0 N and 10 N. In addition, a resistance value of the pressure sensitive material may be approximately 5 k$\Omega$ when the amount of applied force is approximately 1 N and a resistance value of the pressure sensitive material may be approximately 1.5 k$\Omega$ when the amount of applied force is approximately 3 N.

Alternatively or additionally, the predictable resistance-force response curve can be defined by a power log function curve. For example, the power log function curve can be defined as Resistance=1732.8×Applied Force^−0.739.

In another example implementation, the pressure sensitive material can at least partially intervene between pairs of the first conductor, the second conductor and a third conductor, and the method can include: determining a second electrical property of the pressure sensitive material using the third conductor.

Additionally, the method can also include associating the second electrical property with the time from the clock and writing the second electrical property associated with the time to the memory.

Optionally, the method can include reading the second electrical property and the time from the memory, and calculating a time-based change in the second electrical property.

In other implementations, the method can include correlating the time-based change in the second electrical property with the at least one of the control messages. For example, the control messages can be stored in the memory and can be each associated with one or more time based changes in the electrical properties.

Optionally, the first and second electrical properties of the pressure sensitive material can be resistances.

In another example implementation, the pressure sensitive material can at least partially intervene between pairs of the first conductor, the second conductor, the third conductor and a fourth conductor, and the method can include: determining a second electrical property of the pressure sensitive material using the fourth conductor.

Optionally, the method can include determining a position of the amount of pressure on the pressure sensitive material using the first and second electrical properties.

Alternatively or additionally, the method can include associating the position with the time from the clock and writing the position associated with the time to the memory. In addition, the method can include reading the position and the time from the memory and calculating a time-based change to the position. Further, the method can include correlating the time-based change in the position with the at least one of the control messages.

In other implementations, the method can include determining and writing to the memory a series of associated positions, first electrical properties and times to the memory. Optionally, the method can also include determining a path and pressure contour from the series. In addition, the method can include determining whether the path and pressure contour meet a swipe threshold. The method can include correlating the swipe threshold with the at least one of the control messages.

In another example implementation, the method can include determining whether the time-based change in the first electrical property exceeds a threshold associated with the amount of pressure.

Alternatively or additionally, the method can include determining whether a time comparison between the time from the memory and a second time meets a time threshold. Additionally, the method can include using meeting of the pressure and time thresholds as preconditions to communication of the at least one of the control messages.

In other implementations, the method can include correlating meeting of the thresholds with at least one of the control messages. For example, the method can include classifying the time-based change as a tap if the time comparison is less than the time threshold. Alternatively, the method can include classifying the time-based change as a hold if the time comparison is more than the time threshold. In addition, the method can include correlating whether the time-based change is the tap or the hold with the at least one of the control messages.

In another example implementation, the pressure sensitive material may have a plurality of zones and each of the zones can be connected to a pair of conductors.

Optionally, the method can include determining the first electrical property of each of the zones using the pairs of conductors.

Alternatively or additionally, the method can include associating the first electrical property of each of the zones with the time from the clock signal; and writing the first electrical property of each of the zones and the time to the memory. The method can include reading the first electrical property of each of the zones and the time from the memory; and calculating a time-based change in the first electrical property of each of the zones. Additionally, the method can include correlating the time-based change in the first electrical property of each of the zones with at least one of the control messages; and communicating the at least one of the control messages to the system controller.

The zones can be defined by separate portions of the pressure sensitive material. For example, at least two of the zones can overlap. The method can also include detecting a force applied to the zones. For example, the applied force can be detected by determining the first electrical property of the pressure sensitive material. Optionally, the force can applied over at least a portion of the zones that form a strip, a grid, a radius, a spaced array, buttons, etc, or any combination thereof. For example, at least some of the zones can form at least one strip, and the buttons and at least one strip can extend in a U-shaped configuration. In addition, the buttons can form at least one leg of the U-shaped configuration, and the at least one strip can form at least another leg of the U-shaped configuration.

In other implementations, at least some of the zones form at least one grid. In addition, a first array of buttons can be positioned next to the grid. Additionally, a second array of buttons can be positioned next to the grid opposite the first array of buttons. Optionally, two strips can be positioned on opposite sides of the buttons.

Alternatively or additionally, the method can include detecting a force applied to the zones through a cover defining portions corresponding to the zones. For example, the applied force can be detected by determining the first electrical property of the pressure sensitive material. Optionally, the cover portions can include indicia associated with at least one of the control messages. Additionally, the cover portions and corresponding zones can define a button.

In yet another implementation, the method can include detecting a force applied to the pressure sensitive material through a force concentrator positioned against the pressure sensitive material. For example, the applied force can be detected by determining the first electrical property of the pressure sensitive material. Alternatively or additionally, the method can include detecting a force applied to the pressure sensitive material through a cover. In addition, the force concentrator can be positioned between the cover and the pressure sensitive material.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The components in the drawings are not necessarily to scale relative to each other. Like reference numerals designate corresponding parts throughout the several views.

FIGS. 7A-7C are example gesture timing and combination tables;

FIG. 8 is an example table of control functions in an automotive environment;

DETAILED DESCRIPTION

Implementations of the present disclosure now will be described more fully hereinafter. Indeed, these implementations can be embodied in many different forms and should not be construed as limited to the implementations set forth herein; rather, these implementations are provided so that this disclosure will satisfy applicable legal requirements. Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a", "an", "the", include plural referents unless the context clearly dictates otherwise. The term "comprising" and variations thereof as used herein is used synonymously with the term "including" and variations thereof and are open, non-limiting terms.

The term "sheet" as used herein may refer to a structure with a thickness that is a fraction of its remaining two linear dimensions. It need not be a very small thickness with flat surfaces, but could instead be a layer with two relatively opposing surfaces between edges of any general shape between which is defined a thickness, or range of thicknesses that is $\frac{1}{10}$, $\frac{1}{4}$, $\frac{1}{3}$ or $\frac{1}{2}$ of a width or length of the opposed surfaces, for example. Also, the opposing surfaces do not need to be flat or regular in finish, nor precisely parallel from each other. The term "thin sheet" is used herein to define a sheet with thickness of less than $\frac{1}{10}$a dimension of one of the opposing surfaces.

Figure 1:
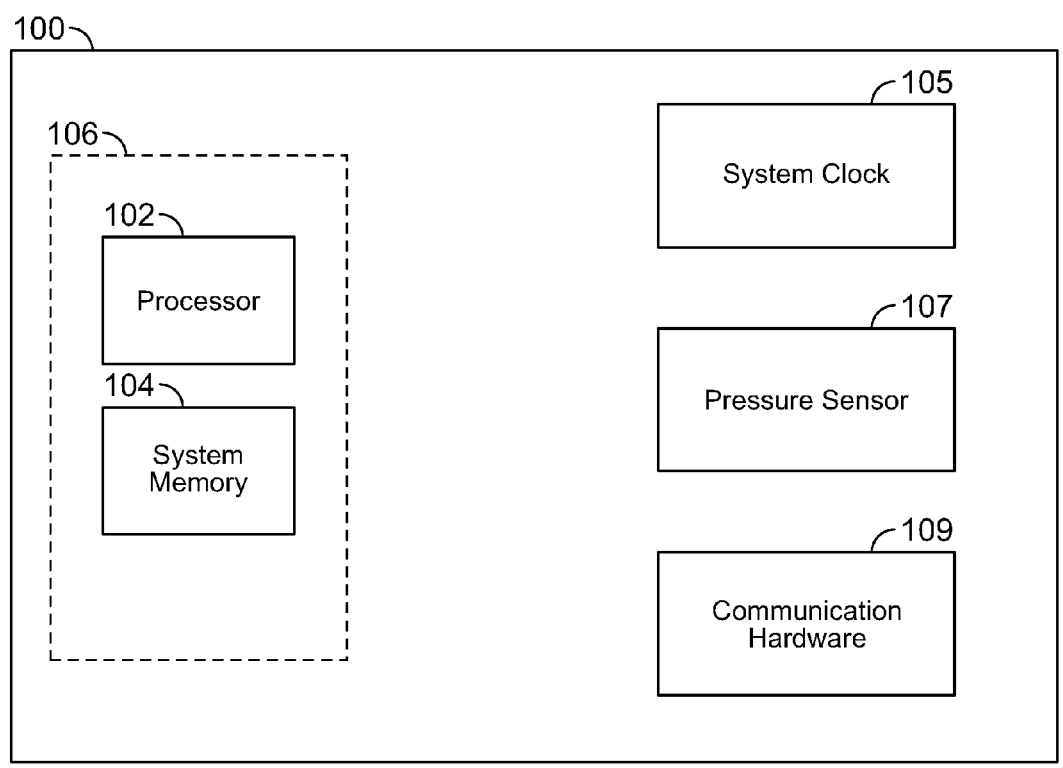
FIG. 1 is a simplified block diagram of an example sensor system.

Referring to FIG. 1, a block diagram of a sensor system 100 according to an implementation of the invention is shown. The sensor system 100 may be used to sense a position and magnitude of force applied to the sensor system 100. In other words, the sensor system 100 may be configured to sense the position of the applied force in either one dimension (e.g., the X- or Y-direction) or two dimensions (e.g., the X- and Y-directions), as well of as the magnitude of the applied force (e.g., force in the Z-direction). The sensor system 100 may include a computing unit 106, a system clock 105, a pressure sensor 107 and communication hardware 109. In its most basic form, the computing unit 106 may include a processor 102 and a system memory 104. The processor 102 may be a standard programmable processor that performs arithmetic and logic operations necessary for operation of the sensor system 100. The processor 102 may be configured to execute program code encoded in tangible, computer-readable media. For example, the processor 102 may execute program code stored in the system memory 104, which may be volatile or non-volatile memory. The system memory 104 is only one example of tangible, computer-readable media. Other examples of tangible, computer-readable media include floppy disks, CD-ROMs, DVDs, hard drives, flash memory, or any other machine-readable storage media, wherein when the program code is loaded into and executed by a machine, such as the processor 102, the machine becomes an apparatus for practicing the disclosed subject matter.

In addition, the sensor system 100 may include the pressure sensor 107 that is configured to change at least one electrical property (e.g., resistance) in response to forces applied to the sensor system 100. Example pressure sensors are discussed below with regard to FIGS. 2A-2B and 5A. Further, the sensor system 100 may include communication hardware 109 that interfaces with the pressure sensor 107 and receives/measures the sensed changes in the at least one electrical property of the pressure sensor 107. Example communication hardware 109 is discussed below with regard to FIGS. 3A-3E and 4A-4D. Additionally, the sensor system 100 may include a system clock 109. The processor 102 may be configured to associate the sensed changes in the at least one electrical property of the pressure sensor 107 with a time from the system clock 107 and store the sensed changes and corresponding time to the system memory 104. Optionally, the processor 102 may be configured to analyze the stored data and associate measured changes in the at least one electrical property of the pressure sensor 107 with various control messages for controlling system functions.

Figure 2A:
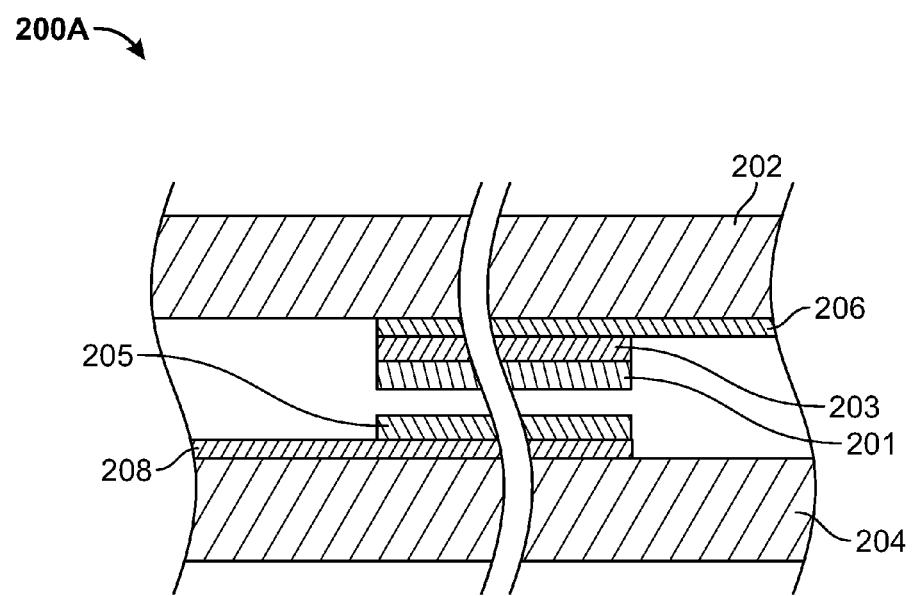
FIG. 2A is a cross-sectional view illustrating an example pressure sensor that may be included in the sensor of FIG. 1.

Referring to FIG. 2A, a cross-sectional view of a pressure sensor 200A according to an implementation of the invention is shown. The pressure sensor 200A may include sheets of carrier material 202, 204, conductors 206, 208, electrodes 203, 205 and a pressure sensitive material 201 configured in a generally symmetric, layered relationship (e.g., a carrier sheet, conductor, and electrode disposed on each side of the pressure sensitive material). The carrier sheets 202, 204, conductors 206, 208, electrodes 203, 205 and pressure sensitive material 201 may be selectively configured to change conductive or electrical characteristics of the pressure sensor 200A according to the forces (or pressures) expected during a dynamic application of pressure. In some implementations, the pressure sensor 200A may include an array of pressure sensing units, each sensing unit including conductors 206, 208, electrodes 203, 205, and pressure sensitive material 201.

The pressure sensitive material 201 may be configured to change at least one electrical property in response to force (or pressure) applied. For example, the pressure sensitive material 201 may be configured to change resistance (e.g., become more or less conductive) in response to applied force. In some implementations, the pressure sensitive material 201 may behave substantially as an insulator in the absence of an applied force and decrease in resistance as the magnitude of the applied force increases. The variable electrical property of the pressure sensitive material 201 may be capable of changing nearly instantaneously, or in near real-time, in response to changes in the applied force. In other words, the variable electrical property of the pressure sensitive material 201 may change such that the user is incapable of detecting a lag between the change in applied force and the change in the electrical property during operation. In addition, the electrical property may continuously vary in response to the applied force. For example, predictable Resistance-Force response curves of a pressure sensitive material according to an implementation of the invention are discussed below with regard to FIGS. 6A and 6B.

The pressure sensitive material 201 may be relatively thin compared to the other layers of the pressure sensor 200A. For example, the pressure sensitive material 201 may be a thin sheet. The pressure sensitive material 201 may be configured to act as an X-Y position coordinate (or just an X- or Y-position coordinate) and Z pressure coordinate sensor, such as the sensors employed in commonly owned U.S. patent application Ser. No. 13/076,226 entitled "Steering Wheel Sensors" and filed on Mar. 30, 2011, which is incorporated herein in its entirety by reference and attached hereto as APPENDIX A. Additional details about the operation of a pressure sensitive material in X, Y and Z space may be found in PCT Patent Application Publication No. WO 2010/109186 entitled "Sensor" and published on Sep. 30, 2010, which is incorporated herein in its entirety by reference and attached hereto as APPENDIX B. The pressure sensitive material 201 may have a range of shapes depending upon the intended application, such as the rectangular shape shown in FIGS. 3A and 4A. The rectangular shape facilitates use of full X-Y position coordinates. Or, for example, the pressure sensitive material 201 may have an elongate or strip shape for single-axis translation or may have a circular shape for rotational coordinate registration.

The pressure sensitive material 201 may be an electroactive material. The pressure sensitive material 201 may, for example, be a carbon nanotube conductive polymer. The pressure sensitive material 201 may be applied to one of the pair of electrodes 203, 205 by a printing process, such as two- or three-dimensional ink jet or screen printing, vapor deposition, or conventional printed circuit technique, such etching, photo-engraving or milling. As smaller particle sizes are used, such as that of grapheme or a grapheme conductive polymer, the pressure sensitive material 201 may also be applied through conventional printed circuit techniques, such as vapor deposition. According to other examples, the pressure sensitive material 201 may be a silicene polymer material doped with a conductor, such as silver or copper.

According to other examples, the pressure sensitive material 201 may be a quantum tunneling composite (QTC), which is a variable resistance pressure sensitive material that employs Fowler-Nordheim tunneling. The QTC is a material commercially made by Peratech (www.peratech.com), of Brompton-on-Swale, UK. The QTC has the ability to change from a near-perfect electrical insulator ($>10^{12} \Omega$) in an unstressed state to a near-perfect conductor ($<1\Omega$) when placed under enough pressure. The QTC relies on tunneling conduction, as opposed to percolation, as the conduction mechanism. An electron may be described as a wave, and therefore, the electron possesses a determinable probability of crossing (i e, tunneling) through a potential barrier. The QTC comprises conductive metal filler particles in combination with an insulator, such as silicone rubber. The metal filler particles may get close to each other, but do not touch, due to the insulator. In order to increase the probability that tunneling will occur, the conductive metal filler particles are provided with spikes that increase the localized electric field at the tips of the spikes, which reduces the size of the effective potential barrier between particles. In addition, when the QTC is placed under pressure, the metal filler particles are forced closer together, which reduces the size of the effective potential barrier between particles. Accordingly, the QTC material in the pressure sensor 200A may act as an insulator when zero pressure or zero force is applied, since the conductive particles may be too far apart to conduct, but as force or pressure is applied, the conductive particles move closer to other conductive particles, so that electrons can pass through the insulator, which changes the resistance of the QTC. Thus, the resistance of the QTC in the pressure sensor 200A is a function of the force or pressure acting upon the pressure sensor 200A.

The carrier sheets 202, 204 are coupled together to form the pressure sensor 200A after the conductors 206, 208, electrodes 203, 205, and pressure sensitive material 201 are deposited thereon. The carrier sheets 202, 204 may, for example, be laminated together, such that the conductors 206, 208, electrodes 203, 205, and pressure sensitive material 201 are in proper alignment. The lamination process may for example be a conventional process using heat and pressure. Adhesives may also be used. The total thickness of the pressure sensor 200A may be approximately 120 microns. According to other examples, the carrier sheets 202, 204 may, for example, be coupled together in other manners (e.g., laminating without heat or pressure). Further, the pressure sensor 200A may have a different total thickness (e.g., greater than or equal to approximately 70 microns).

Figure 2B:
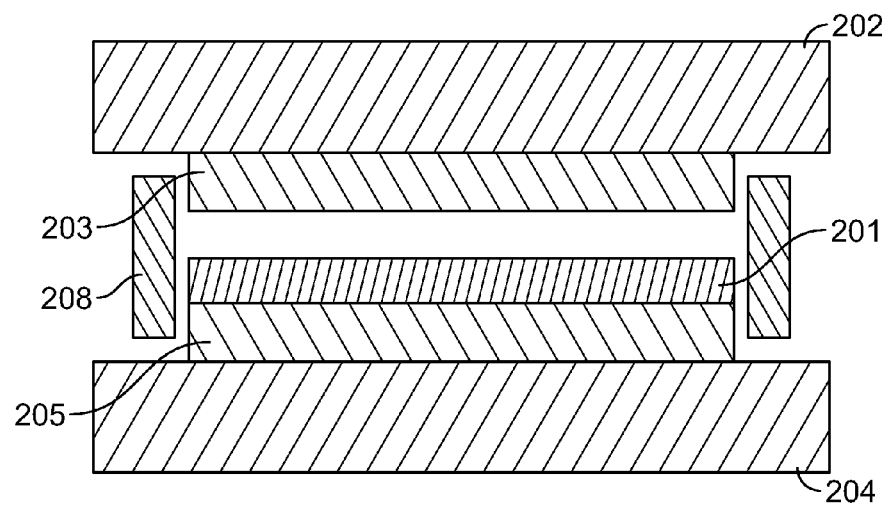
FIG. 2B is a cross-sectional view illustrating another example pressure sensor that may be included in the sensor of FIG. 1.

Referring to FIG. 2B, another example pressure sensor 200B is shown. The pressure sensor 200B includes carrier sheets 202, 204, electrodes (i.e., conductive pads) 203, 205 and pressure sensitive material 201. The pressure sensor 200B may be formed by printing or depositing electrodes 203 and 205 on carrier sheets 202 and 204, respectively. The conductive pads, for example, may be comprised of printed carbon, copper, tin, silver or other electro-active materials.

In addition, the pressure sensitive material 201 may then be printed or deposited over one of electrodes 203 or 205. For example, as shown in FIG. 2B, the pressure sensitive material 201 may be printed or deposited over electrode 205. The pressure sensor 200B may then be formed by bonding carrier sheets 202 and 204. For example, carrier sheets 202 and 204 may be bonded through a support layer 208. As discussed above, the pressure sensitive material 201 may be configured to change at least one electrical property in response to force (or pressure) applied. For example, the pressure sensitive material 201 may be configured to change resistance (e.g., become more or less conductive) in response to applied force. Thus, when force (or pressure) is applied, the pressure sensor 200B becomes conductive and current flows between electrodes 203 and 205. In addition, the magnitude of electrical conduction between electrodes 203 and 205 varies in relation to the magnitude of force applied to the pressure sensor 200B. As discussed below with regard to FIG. 6C, it may be possible to change the electrical property-force response curve by changing one or more of the characteristics of the layers of the pressure sensor 200B, such as the dimensions and/or materials of the layers of the pressure sensor 200B.

Although not shown in FIG. 2B, conductors or electrical traces may be printed or deposited on each of electrodes 203 and 205. The conductors or electrical traces may provide electrical connections to electrodes 203 and 205. For example, the conductors or electrical traces may be conductors used in voltage divider circuits discussed below with regard to FIGS. 3A-3E and 4A-4D. In particular, the conductors or electrical traces may be configured for measuring position coordinates (X- and Y-position coordinates or an X- or Y-position coordinate) and an amount of force applied. Alternatively, the conductors or electrical traces may be configured for measuring an amount of force applied to the pressure sensor. In this configuration, the pressure sensor may be used to detect application of a force exceeding a predetermined threshold, for example. As discussed above, the pressure sensitive material may have a predictable electrical property-force response curve, and therefore, it may be possible to detect application of a force exceeding a predetermined threshold by measuring the electrical property of the pressure sensitive material.

Figure 2C:
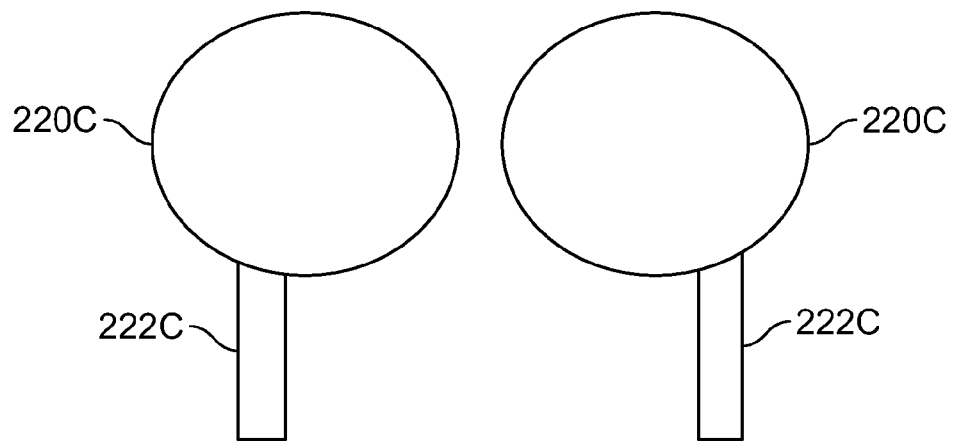
FIGS. 2C-2E illustrate example electrode and electrical trace configurations included in the pressure sensors described herein.

Referring to FIG. 2C, an example electrode and electrical trace configuration for measuring an amount of force is shown. FIG. 2C illustrates a plan view of electrodes 220C and conductors or electrical traces 222C. In this example, the pressure sensitive material may be disposed between electrodes 220C when electrodes 220C are incorporated into a pressure sensor. As discussed above, the pressure sensitive material may be printed or deposited over one of electrodes 220C. In FIG. 2C, the electrical traces 222C are connected at the periphery of each electrode 220C. For example, the conductors or electrical traces 222C are electrically connected at a point along the periphery of each electrode 220C.

Figure 2D:
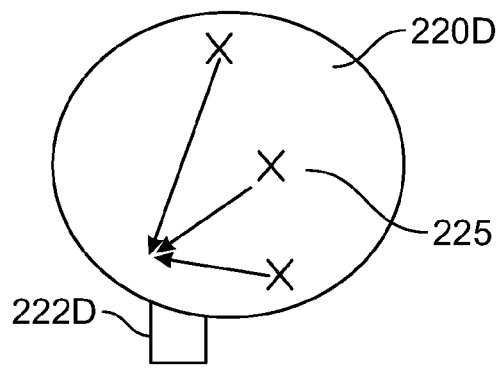

There may be resistance variation related to the distance between the contact point on the pressure sensor (i.e., the point where force is applied to the sensor) and the point where the electrical traces 222C are connected to the electrodes 220C. For example, FIG. 2D illustrates a number of contact points 225 relative to an electrode 220D of the pressure sensor. In FIG. 2D, the sheet resistance of the electrode 220D between the contact points 225 and the point where the electrical trace 222D is connected to the electrode 220D increases as the distance between the contact points 225 and the point where the electrical trace 222D is connected to the electrode 220D increase. The resistance variation may be at a maximum when the contact point on the pressure sensor is located at a point on the periphery of the electrode 220D directly opposite to a point on the periphery of the electrode 220D where the electrical trace 222D is connected.

As discussed above, the pressure sensitive material may have a predictable electrical property-force response curve, which may be used to determine the magnitude of force applied to the pressure sensor. However, because the sheet resistance of the electrode 220D is variable, application of the same magnitude of force on the pressure sensor at different locations relative to the point where the electrical trace 222D is connected to the electrode 220D yields different measured electrical properties (e.g., resistances), which are correlated with different measured force values along the electrical property-response curve. Accordingly, the resistance variation caused by the distance between the contact points 225 on the pressure sensor and the point where the electrical trace 222D is connected to the electrode 220D may introduce errors in calculating the magnitude of the applied force based on the measured electrical property.

Figure 2E:
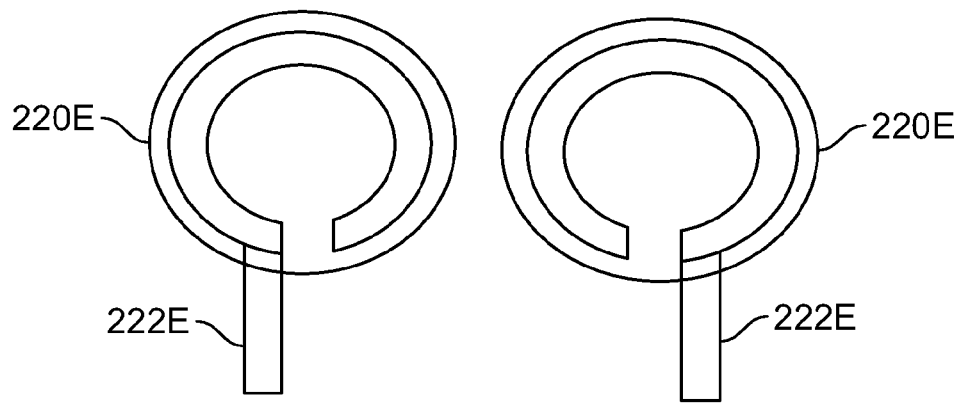

In order to minimize resistance variation caused by the distance between the contact points 225 on the pressure sensor and the point where the electrical trace 222D is connected to the electrode 220D, electrical traces may disposed on or adjacent to the periphery of the electrodes. For example, as shown in FIG. 2E, the electrical traces 222E may be printed or deposited on or adjacent to the periphery of electrodes 220E. In FIG. 2E, the electrical traces 222E are provided along approximately the entire periphery of electrodes 220E. Alternatively, the electrical traces may be provided along a portion of the periphery of the electrodes, such as in a partial arc. In this configuration, the distance between the contact points on the pressure sensor and the point where the electrical trace is connected to the electrode may be reduced by as much as half the distance between the center and the periphery of the electrode.

Selective placement of the electrical traces may also be used to shrink contact point distances for a variety of shapes and sizes of electrodes. For example, peripheral placement could be near the edges of a square electrode or undulating lines along a rectangular electrode.

Figure 3A:
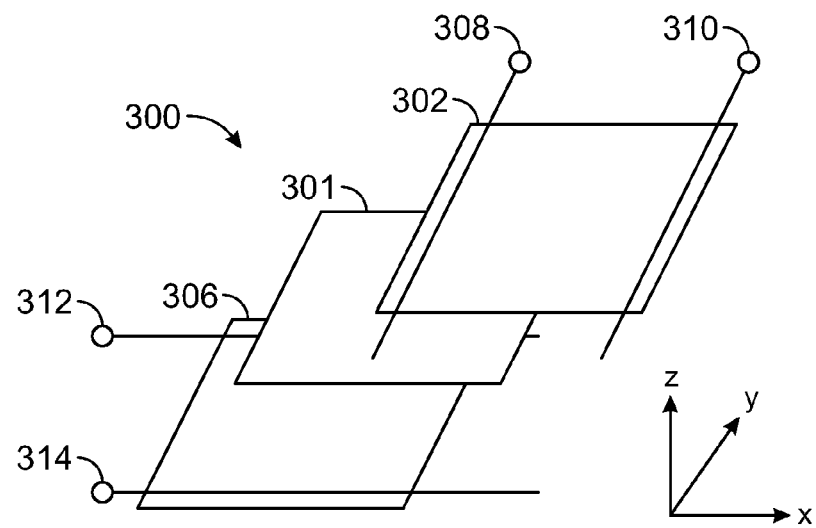
FIG. 3A is a plan view illustrating an example pressure sensing unit included in the pressure sensors of FIGS. 2A-2B.

FIG. 3A illustrates an example pressure sensing unit 300 included in the sensors of FIGS. 2A-B. The pressure sensing unit 300 may include electrodes 302, 306, conductors 308, 310, 312, 314 and a pressure sensitive material 301. FIGS. 3B-3E illustrate voltage divider circuit diagrams for detecting X-Y-Z coordinate information using four communication lines (i.e., conductors 308, 310, 312, 314). As shown in FIG. 3A, electrode 302 may include conductors 308, 310, each conductor being arranged substantially in parallel on opposite sides of a surface of electrode 302. By applying a voltage across conductors 308, 310, it is possible to establish a potential between the conductors. In addition, electrode 306 may include conductors 312, 314, each conductor being arranged substantially in parallel on opposite sides of a surface of electrode 306. By applying a voltage across conductors 312, 314, it is possible to establish a potential between the conductors. In the implementation shown in FIG. 3A, the electric potential between the conductors of electrode 302 and the electric potential between the conductors of electrode 306 may be substantially perpendicular.

Figure 3B:
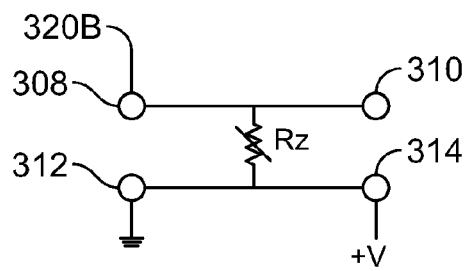
FIGS. 3B-3E are example circuit diagrams of voltage dividers for sensing a position and magnitude of a force applied to the pressure sensing unit of FIG. 3A.

Referring to FIG. 3B, a voltage divider circuit diagram for detecting the position of applied force in a first direction (e.g., the X-direction) is shown. As discussed above, a voltage may be applied across conductors 312, 314 in order to establish a potential between the conductors. For example, a positive voltage may be applied to conductor 314 and conductor 312 may be grounded. The positive voltage may be 5V, for example. However, the positive voltage may be greater than or less than 5V. When a pressure is applied to the pressure sensing unit 300, electrodes 302, 306 may each contact the pressure sensitive material 301 at a contact point, and a voltage of electrode 306 is applied to electrode 302 via the pressure sensitive material 301 at the contact point. Then, voltage may be measured at terminal 320B (i.e., conductor 308) while conductor 310 is disconnected. The voltage at terminal 320B is proportional to the distance between the contact point and conductor 308. In particular, the voltage at the terminal 320B is proportional to the sheet resistance of electrode 302 between the contact point and conductor 308. Accordingly, the position of applied force in the first direction may be derived from the voltage at terminal 320B. In addition, the roles of the conductors 308, 310 and 312, 314 may be reversed (e.g., the positive voltage may be applied to conductor 312 and conductor 314 may be grounded and/or the voltage may be measured at conductor 310 while conductor 308 is disconnected).

Figure 3C:
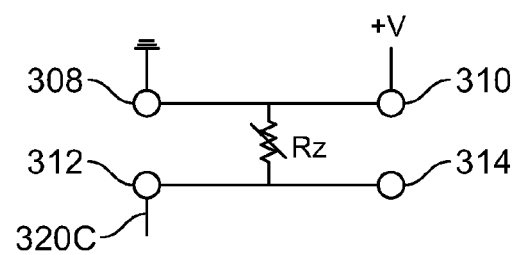

Referring to FIG. 3C, a voltage divider circuit diagram for detecting the position of applied pressure in a second direction (e.g., the Y-direction) is shown. As discussed above, a voltage may be applied across conductors 308, 310 in order to establish a potential between the conductors. For example, a positive voltage may be applied to conductor 310 and conductor 308 may be grounded. When a force is applied to the pressure sensing unit 300, electrodes 302, 306 may each contact the pressure sensitive material 301 at a contact point, and a voltage of electrode 302 is applied to electrode 306 via the pressure sensitive material 301 at the contact point. Then, voltage may be measured at terminal 320C (i.e., conductor 312) while conductor 314 is disconnected. The voltage at terminal 320C is proportional to the distance between the contact point and conductor 312. In particular, the voltage at the terminal 320C is proportional to the sheet resistance of electrode 306 between the contact point and conductor 312. Accordingly, the position of applied force in the second direction may be derived from the voltage at terminal 320C. In addition, the roles of the conductors 308, 310 and 312, 314 may be reversed.

Figure 3D:
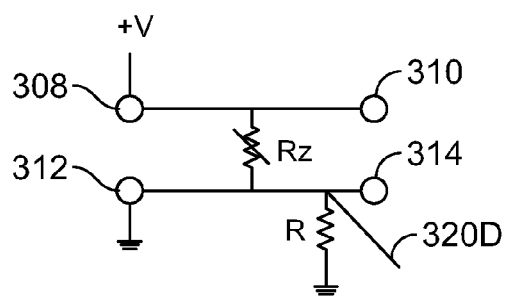
Figure 3E:
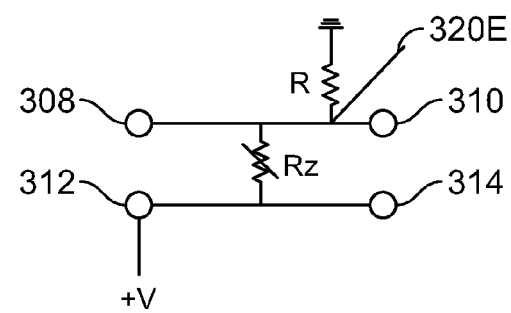

Referring to FIGS. 3D and 3E, voltage divider circuits for detecting a magnitude of applied force in a third direction (e.g., the Z-direction) are shown. A positive voltage (e.g., 5 V) may be applied to conductor 308 of electrode 302 while conductor 310 is disconnected, as shown in FIG. 3D. In addition, conductor 314 of electrode 306 may be connected to ground through a resistor R while conductor 312 is disconnected. The resistor R may have a known value, for example 4.7 kΩ, or any other known resistance value. When a force is applied to the pressure sensing unit 300, electrodes 302, 306 may each contact the pressure sensitive material 301 at a contact point, and current may flow from conductor 308 to conductor 314 through the contact point. Then, voltage may be measured at terminal 320D (i.e., conductor 314), which represents the voltage drop across resistor R. Further, as shown in FIG. 3E, a positive voltage (e.g., 5 V) may be applied to conductor 312 of electrode 306 while conductor 314 is disconnected. In addition, conductor 310 of electrode 302 may be connected to ground through a resistor R (with a known value, for example 4.7 kΩ) while conductor 308 is disconnected. When a force is applied to the pressure sensing unit 300, electrodes 302, 306 may each contact the pressure sensitive material 301 at a contact point, and current may flow from conductor 312 to conductor 310 through the contact point. Then, voltage may be measured at terminal 320E (i.e., conductor 310), which represents the voltage drop across resistor R. In addition, the roles of the conductors 308, 310 and 312, 314 may be reversed.

By using the voltages measured at terminals 320D and 320E, it is possible to derive the value of the resistance of the conductive path (e.g., Rz shown in FIGS. 3D and 3E). For example, the resistance Rz is proportional to the sum of the inverse of the voltage measured at terminal 320D and the inverse of the voltage measured at terminal 320E. In addition, as discussed above, the resistance Rz is the resistance of the pressure sensitive material 301, which is dependent on the magnitude of the force applied to the pressure sensing unit 300. Accordingly, by deriving the resistance Rz it is possible to determine the magnitude of applied force in the Z-direction.

Figure 4A:
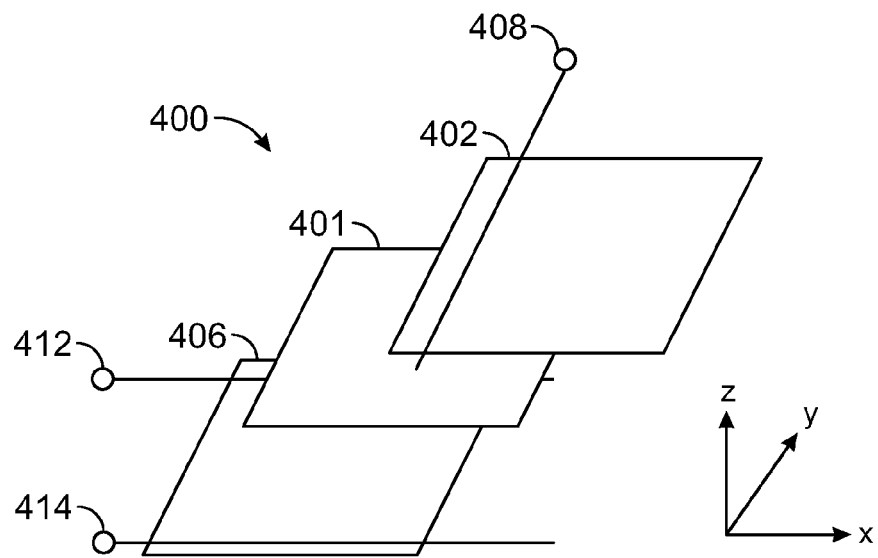
FIG. 4A is a plan view illustrating another example pressure sensing unit included in the pressure sensors of FIGS. 2A-2B.
Figure 4B:
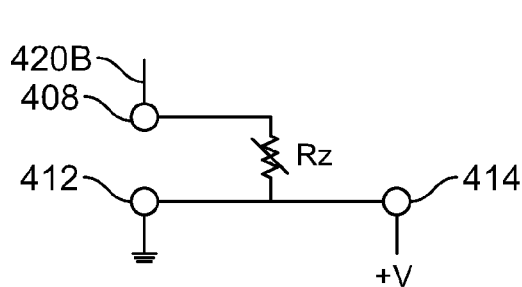
FIGS. 4B-4D are example circuit diagrams of voltage dividers for sensing a position and magnitude of a force applied to the pressure sensing unit of FIG. 4A.
Figure 4C:
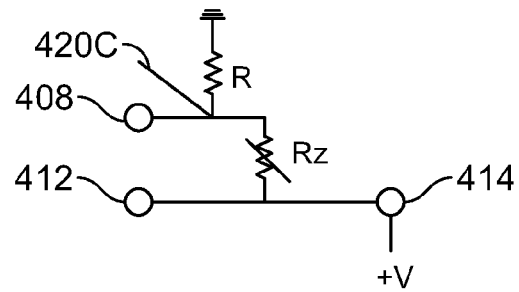
Figure 4D:
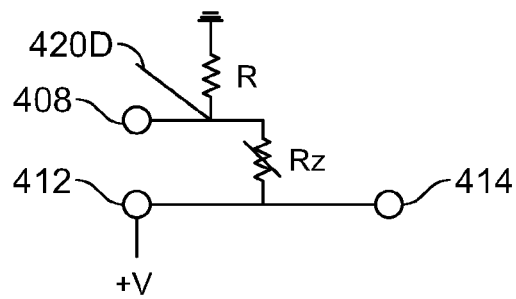

FIG. 4A illustrates an example pressure sensing unit 400 included in the sensors of FIG. 2A-B. The pressure sensing unit 400 may include electrodes 402, 406, conductors 408, 412, 414 and a pressure sensitive material 401. FIGS. 4B-4D illustrate voltage divider circuit diagrams for detecting positional coordinate information (e.g., X-Z coordinate information) using three communication lines (e.g., conductors 408, 412, 414). It is also possible to detect Y-Z coordinate information using three communications line as well. As shown in FIG. 4A, electrode 402 may include conductor 408, which is arranged substantially in parallel on one side of a surface of electrode 402. In addition, electrode 406 may include conductors 412, 414, each conductor being arranged substantially in parallel on opposite sides of a surface of electrode 406. By applying a voltage across conductors 412, 414, it is possible to establish a potential between the conductors.

Referring to FIG. 4B, a voltage divider circuit diagram for detecting the position of applied force in a first direction (e.g., the X-direction) is shown. As discussed above, a voltage may be applied across conductors 412, 414 in order to establish a potential between the conductors. For example, a positive voltage may be applied to conductor 414 and conductor 412 may be grounded. The positive voltage may be 5V, for example. However, the positive voltage may be greater than or less than 5V. When a force is applied to the pressure sensing unit 400, electrodes 402, 406 may each contact the pressure sensitive material 401 at a contact point, and a voltage of electrode 406 is applied to electrode 402 via the pressure sensitive material 401 at the contact point. Then, voltage may be measured at terminal 420B (i.e., conductor 408). The voltage at terminal 420B is proportional to the distance between the contact point and conductor 408. In particular, the voltage at the terminal 420B is proportional to the sheet resistance of electrode 402 between the contact point and conductor 408. Accordingly, the position of applied force in the first direction may be derived from the voltage at terminal 420B. In addition, the conductors 412, 414 may be reversed (e.g., the positive voltage may be applied to conductor 412 and conductor 414 may be grounded).

Referring to FIGS. 4C and 4D, voltage divider circuits for detecting a magnitude of applied force in a second direction (e.g., the Z-direction) are shown. A positive voltage (e.g., 5 V) may be applied to conductor 414 of electrode 406 while conductor 412 is disconnected, as shown in FIG. 4C. In addition, conductor 408 of electrode 402 may be connected to ground through a resistor R. The resistor R may have a known value, for example 4.7 kΩ, or any other known resistance value. When a force is applied to the pressure sensing unit 400, electrodes 402, 406 may each contact the pressure sensitive material 401 at a contact point, and current may flow from conductor 414 to conductor 408 through the contact point via the pressure sensitive material 401. Then, voltage may be measured at terminal 420C (i.e., conductor 408), which represents the voltage drop across resistor R. Further, as shown in FIG. 4D, a positive voltage (e.g., 5 V) may be applied to conductor 412 of electrode 406 while conductor 414 is disconnected. In addition, conductor 408 of electrode 402 may be connected to ground through a resistor R (with a known value, for example 4.7 kΩ). When a force is applied to the pressure sensing unit 400, electrodes 402, 406 may each contact the pressure sensitive material 401 at a contact point, and current may flow from conductor 412 to conductor 408 through the contact point via the pressure sensitive material 401. Then, voltage may be measured at terminal 420D (i.e., conductor 408), which represents the voltage drop across resistor R.

By using the voltages measured at terminals 420C and 420D, it is possible to derive the value of the resistance of the conductive path (e.g., Rz shown in FIGS. 4C and 4D). For example, the resistance Rz is proportional to the sum of the inverse of the voltage measured at terminal 420C and the inverse of the voltage measured at terminal 420D. In addition, as discussed above, the resistance Rz is the resistance of the pressure sensitive material 401, which is dependent on the magnitude of the force applied to the pressure sensing unit 400. Accordingly, by deriving the resistance Rz it is possible to determine the magnitude of applied force in the Z-direction.

Figure 5A:
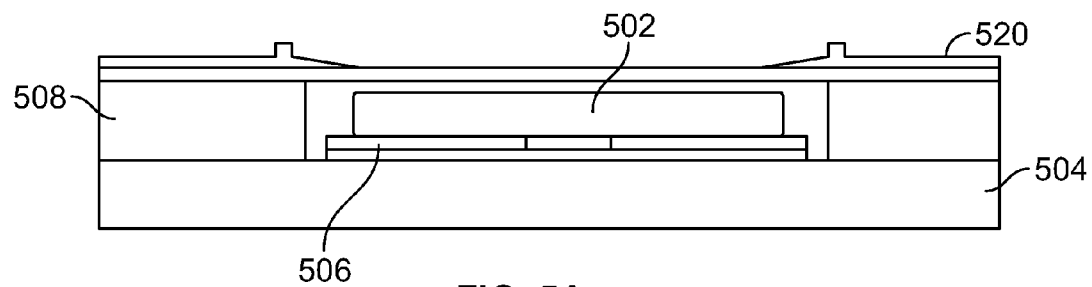
FIG. 5A is a cross-sectional view illustrating an example pressure sensor that may be included in the sensor of FIG. 1.

FIG. 5A illustrates a cross-sectional view of a pressure sensor 500 according to another implementation of the invention. The pressure sensor 500 may include a cover 520, a force concentrator 502 and a pressure sensing unit 506. The cover 520 may be a molded cover provided with in mold decoration (IMD) or in mold labeling (IML) to provide indicia and/or passive haptic features. In some implementations, the indicia may be related to the control functions. The pressure sensing unit 506 may be a pressure sensing unit configured as discussed above with regard to FIGS. 3A and 4A. The pressure sensing unit 506 may be formed inside an opening or cavity formed in a support layer 508, which is layered on top of a reaction surface 504. The physical dimensions and materials of the cover 520 may be chosen such that the cover 520 may deform under force applied by a user. For example, the cover 520 may be designed to deflect inwardly when a predetermined force is applied by the user. In addition, the physical dimensions and materials of the support layer 508 may be chosen such that a gap is defined between the cover 520 and the force concentrator 502. In this case, the cover 520 must be displaced by a predetermined distance before making contact with the force concentrator 502. The gap may also be helpful in providing design tolerances necessary to manufacture the pressure sensor 500. The physical dimensions and materials of the force concentrator 502 may also be chosen to absorb a predetermined amount of applied force. Accordingly, the design characteristics of the cover 520, force concentrator 502, support layer 508, etc. may be varied in order to configure the force response, in particular the initial force sensitivity, of the pressure sensor 500. This is discussed below with regard to FIG. 6C.

Figure 5B:
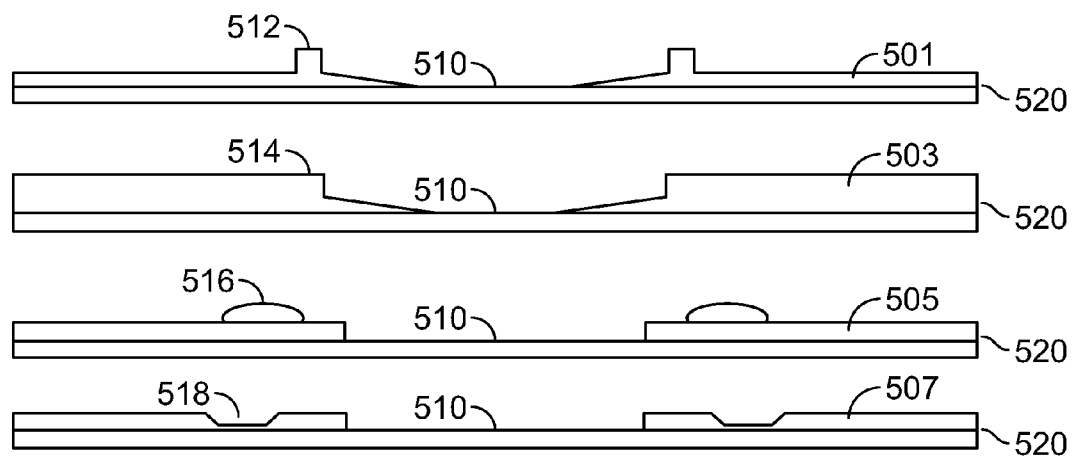
FIG. 5B are cross-sectional views of covers included in the pressure sensor of FIG. 5A.

FIG. 5B illustrates various covers 520 having passive haptic features according to implementations of the invention. The covers 520 may be provided on top of a pressure-sensitive surface of the pressure sensor 500 shown in FIG. 5A, and the covers 520 may be arranged such that the passive haptic features are aligned over one or more pressure sensitive areas (e.g., pressure sensing units) of the pressure sensor 500. In addition, the passive haptic features may serve to guide a user to the pressure sensitive areas. The passive haptic features can be provided by over-molded layers 501, 503, 505, 507, for example. In particular, the over-molded layers may include combinations of embossing, debossing, protrusions, recesses, Braille, etc. as the passive haptic features. The over-molded layers 501, 503, 505, 507 may be formed separately from, or integrally with, the covers 520. In some implementations, the passive haptic features may be part of a haptic system that is in communication with the pressure sensitive system. For example, the passive haptic features may provide the user with haptic feedback based on the amount of detected force.

As shown in FIG. 5B, the passive haptic features may take many forms, including but not limited to, posts 512, ledges 514, protruding portions 516, concave portions 518 and recesses 510. For example, over-molded layer 501 includes posts 512 that flank the recess 510. The posts 512 may guide the user toward the pressure sensitive area, which may be below the recess 510. In addition, over-molded layer 503 includes ledges 514 that drop off and then taper into the recess 510, which also may guide the user to the pressure sensitive area. Further, over-molded layer 505 includes protruding portions 516 that flank the recess 510, while over-molded layer 507 includes concave portions 518 that flank the recess 510. The posts 512, ledges 514, protruding portions 516 and concave portions 518 may be any of any shape, design and/or size such that they guide the user to the pressure sensitive areas.

Figure 6A:
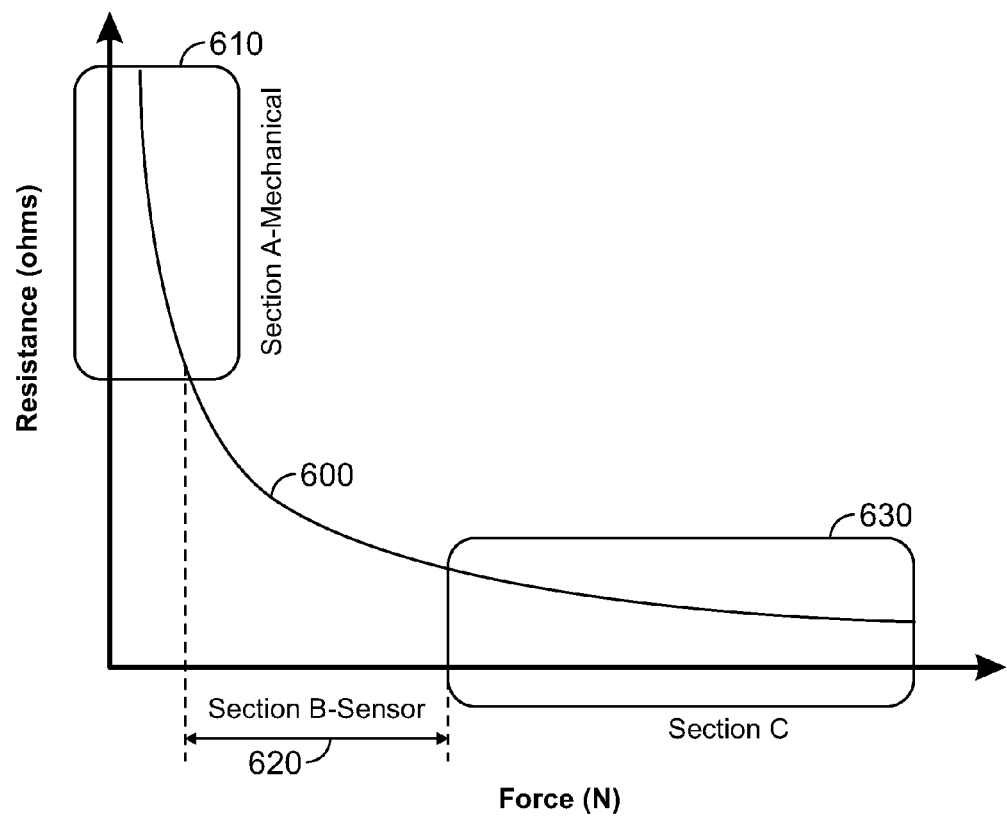
FIG. 6A illustrates an example Resistance-Force response curve of a pressure sensitive material according to an implementation of the invention.

The pressure sensitive material may have a predictable electrical property-force response curve. Referring to FIG. 6A, an example Resistance-Force response curve of a pressure sensitive material according to an implementation of the invention is shown. As discussed above, the pressure sensitive material may be configured to change at least one electrical property (e.g., resistance) in response to force (or pressure) applied. By using such a pressure sensitive material, it may be possible to configure the sensor to detect the position of the applied force, as well as the magnitude of the applied force. One example of a pressure sensitive material is a QTC material, which is discussed above.

In FIG. 6A, the Resistance-Force response curve 600 may be divided into sections. For example, in Section A—Mechanical 610, small changes in force result in large changes in resistance. This section of the Resistance-Force response curve 600 may be useful for ON/OFF switching applications implemented with mechanical resistance due to the relatively large drop in the resistance of the pressure sensitive material based on a relatively small change in the applied force. For example, when the applied force is less than a predetermined threshold dictated wholly or partially by mechanical switching components, the pressure sensitive material may act substantially as an insulator. However, when the applied force is greater than the predetermined mechanical threshold, the pressure sensitive material may act substantially as a conductor.

In Section B—Sensor 620, the change in resistance based on a change in applied force is more linear than in Section A—Mechanical 610. In addition, the change in resistance based on a change in applied force is relatively more predictable. Thus, this section of the Resistance-Force response curve 600 may be useful for pressure sensor operations discussed below where combinations of the position and magnitude of the applied force may be correlated with a plurality of control messages. In Section C 630, large changes in force result in small changes in resistance. This section of the Resistance-Force response curve 600 may be useful for detection operations. For example, when the resistance of the pressure sensitive material falls below a predetermined value, application of a predetermined magnitude of force may be detected. As discussed below with regard to FIG. 6C, the force ranges in which Section A—Mechanical 610, Section B—Sensor 620 and Section C 630 reside may be shifted by changing the characteristics and materials of the different layers of the pressure sensor.

Figure 6B:
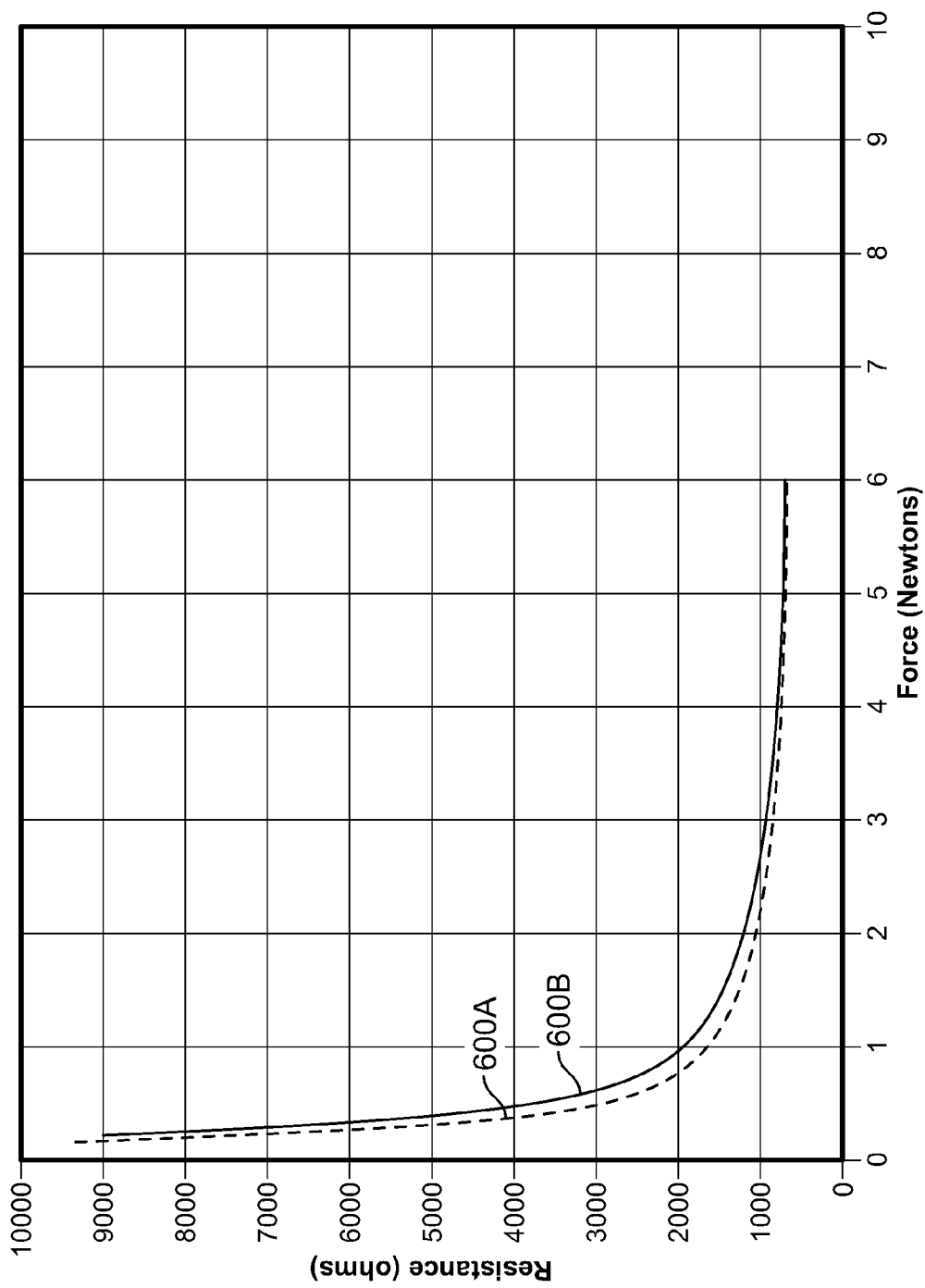
FIG. 6B illustrates example Resistance-Force response curves of a pressure sensitive material according to an implementation of the invention.

Referring to FIG. 6B, example Resistance-Force response curves of a pressure sensitive material according to an implementation of the invention are shown. In FIG. 6B, the Resistance-Force response curve during load removal 600A is shown. In addition, the Resistance-Force response curve during load application 600B is shown. The pressure sensitive material may act substantially as an insulator in the absence of applied force. For example, the resistance of the pressure sensitive material when no force is applied (e.g., 0 N) may exceed approximately $10^{12}\Omega$. When substantial force is applied, the pressure sensitive material may act substantially as a conductor. For example, the resistance of the pressure sensitive material when substantial force is applied (e.g., 10 N) may be less than approximately $1\Omega$. The resistance of the pressure sensitive material in response to intermediate pressures of 0.5 N, 1.0 N, 2.0 N, 3.0 N and 4.0 N may be approximately less than or equal to 8 k$\Omega$, 5 k$\Omega$, 3 k$\Omega$, 1.5 k$\Omega$ and 1.25 k$\Omega$. Optionally, the resistance values discussed above may vary, for example, by 10%.

In addition, the resistance of the pressure sensitive material may continuously vary in relation to the applied force. Particularly, the pressure sensitive material may incrementally change resistance for incremental changes in applied force, however small. The variation in resistance may also be predictable over the range of applied force (e.g., between approximately $10^{12}$ and $1\Omega$ over an applied pressure range of 0-10 N) as shown in FIG. 6B. Moreover, the resistance of the pressure sensitive material may change substantially in real-time (i.e., instantaneously) in response to a change in the applied force. Thus, in operation, a user would not be capable of detecting any lag between the change in the resistance and the change in the applied force.

Figure 6C:
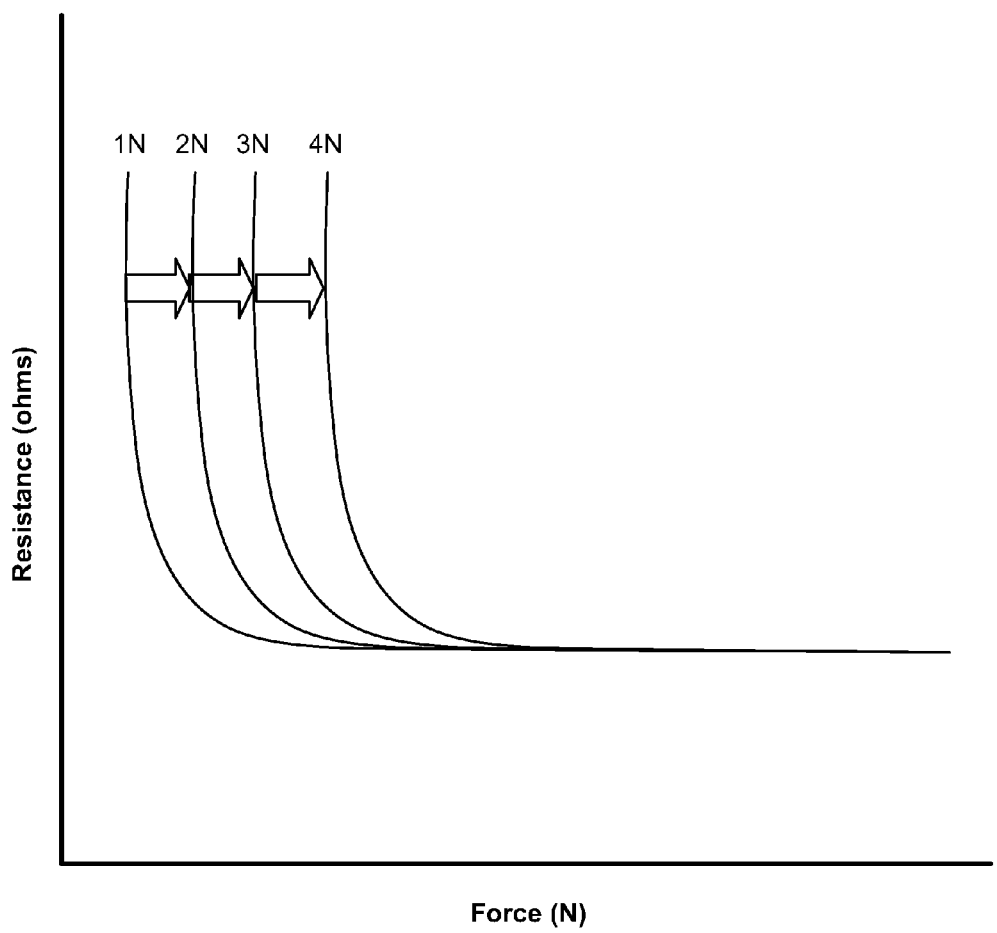
FIG. 6C illustrates Resistance-Force response curve shifting according to an implementation of the invention.

Referring to FIG. 6C, in addition to taking advantage of the pressure response provided by the pressure sensitive material, the pressure response of the sensor may be designed by changing the characteristics of other layers in the sensor, such as the cover 520, support layer 508, force concentrator 502, carrier sheets 202, 204, electrodes 203, 205, etc. discussed above with regard to FIGS. 2A-2B and 5A-5B. For example, the pressure response of the sensor may be designed by selecting the materials and physical dimensions of the other layers. By changing the materials and dimensions of the other layers, it may be possible to change how the other layers interact, for example, how much force is required to be applied to the sensor in order to apply force to the pressure sensitive material. In particular, it may be possible to offset the pressure response of the sensor either rightward (e.g., requiring more initial applied force) or leftward (e.g., requiring less initial applied force) before force is applied to the pressure sensitive material.

In some implementations, a gap (or space) may be provided to offset the pressure response of the sensor rightward by a predetermined amount of force. By providing a gap, a predetermined amount of mechanical displacement of one or more layers is required before force is applied to the pressure sensitive material. For example, a gap may be provided between the pressure sensitive material 201 and electrode 205 as shown in FIG. 2A or between the pressure sensitive material 201 and electrode 203 as shown in FIG. 2B. This gap may be provided using the adhesive bonding the carrier sheets 202, 204. Optionally, a gap may be provided between the cover 520 and the force concentrator 502 as shown in FIG. 5A. This gap may be provided using the support layer 508. The gap is not limited to the above examples, and may be provided between any two adjacent layers.

In other implementations, the sensor may be preloaded (e.g., by applying an external load to the sensor) to shift the pressure response of the sensor leftward by a predetermined amount. Preloading drops the initial resistance of the sensor by pushing the zero (external) load state rightward on the curve. For example, preloading could lower the initial resistance of the pressure sensitive material 201 before an external load is applied. Thus, at zero load, the pressure sensitive material 201 could be in the Section B 600 of the curve of FIG. 6A.

Alternatively or additionally, the materials and physical dimensions of the sensor layers may be selected to offset the pressure response of the sensor. Materials with greater thickness and lower elasticity (greater rigidity) may be used for one or more of the layers in order to offset the pressure response of the sensor rightward. By using materials with greater thickness and lower elasticity, greater force must be applied in order to displace the layers.

By utilizing the pressure sensitive material having a predictable and continuously variable electrical property-force response curve, the sensor may be easily adapted for a number of different uses. The user, for example, may take advantage of the predictable response. If a greater or lesser amount of applied force is desired before a control action is taken, the user need only look to the electrical property-force curve and select the electrical property for the desired applied force. In other words, physical redesign of the sensor is not required.

The pressure sensors 200A and 200B shown in FIGS. 2A-B may be used within the sensor of FIG. 1 to generate control messages for use in controlling various system features. For example, the sensor may be used in an automotive environment to control a variety of automotive control functions. Referring to FIG. 8, an example table of automotive functions is shown. In the automotive environment, the sensor may be used to control media systems (audio, visual, communication, etc.), driving systems (cruise control), climate control systems (heat, A/C, etc.), visibility systems (windshield wipers, lights, etc.), and other control systems (locks, windows, mirrors, etc.). In one example, the sensor may be utilized to receive a user input, such as a force applied to the sensor, and generate a control message, such as increasing or decreasing volume of a media system, based on the position and magnitude of the applied force. A table of control messages may be stored, for example, in the system memory 104 shown in FIG. 1. After storing and analyzing the user inputs, a table look-up may be performed to correlate the user inputs with particular control messages. The sensor may also be used to control many types of control system functions in many types of environments using the principles discussed herein.

As discussed above, the sensor may be configured to sense the position (e.g., one-dimensional or two-dimensional position) of the applied force, as well as a magnitude of the applied force. Combinations of the position and magnitude of the applied force may be correlated with a plurality of control messages, each control message allowing a user to control a system feature such as turning a feature ON/OFF, adjusting levels of the feature, selecting options associated with the feature, etc. For example, voltage dividers discussed above with regard to FIGS. 3B-3E and 4B-4D may be utilized to detect the position and magnitude of the applied force. In particular, when the force is applied to the sensor, electrodes may be placed into electrical communication (e.g., current flows from one electrode to the other electrode through the pressure sensitive material).

Voltages measured at the electrode(s) may then be used to calculate the position and magnitude of the applied force.

Particularly, the position of the applied force in the X- and/or Y-direction may be proportional to the sheet resistance of an electrode between the contact point and the measurement terminal, and the magnitude of the applied force may be proportional to the resistance of the pressure sensitive material. In other words, electrical properties of the sensor are variable based on the position and magnitude of the applied force.

In addition, electrical properties of the sensor may be measured using the voltage dividers shown in FIGS. 3B-3E and 4B-4D, and the measured electrical properties may be associated with a time from the system clock 105 and written to the system memory 104 shown in FIG. 1. Thereafter, it may be possible to calculate the time-based change in the measured electrical properties, which may then be associated with a particular control message. For example, after calculating the time-based change in the measured electrical properties, a table look-up may be performed to correlate the time-based change to one of the control messages stored in the system memory 104 shown in FIG. 1, for example.

Referring to FIGS. 7A-7C, example gesture timing and combination tables are shown. FIG. 7A shows an example gesture timing table. As discussed above, it may be possible to correlate the time-based change in the measured electrical properties with a particular control message. For example, a tap may be defined as a force applied to a single location of the sensor for less than a predetermined amount of time, and the tap may be correlated with a control message allowing a user to control a system feature. In one implementation, the single location may be a pressure sensitive area that includes one or more pressure sensing units arranged in close proximity, and the predetermined time may be 0.5 seconds. The predetermined time may be more or less than 0.5 seconds. The tap may be defined as application of any magnitude of force for less than the predetermined amount of time. Alternatively, taps may be divided into discrete force threshold levels (e.g., P1<1 N, P2<2N, P3<3N, etc.), each different threshold level being associated with a different control function, in order to increase the number of possible control functions. Although three discrete threshold levels for tags are shown in FIGS. 7B-7C, there may be more or less discrete threshold levels.

In addition, a hold may be defined as a force applied to a single location of the sensor for greater than a predetermined amount of time, and the hold may be correlated with a control message allowing a user to control a system feature. In one implementation, the single location may be a pressure sensitive area that includes one or more pressure sensing units arranged in close proximity, and the predetermined amount of time may be 1.0 second. The predetermined amount of time may also be more or less than 1.0 seconds. Similarly to the tap, the hold may be defined as application of any magnitude of force for greater than the predetermined amount of time. Optionally, holds may be divided into discrete force threshold levels, each different threshold level being associated with a different control function, in order to increase the number of possible control functions. Although three discrete threshold levels are shown in FIGS. 7B-7C, there may be more or less discrete threshold levels.

Figure 9:
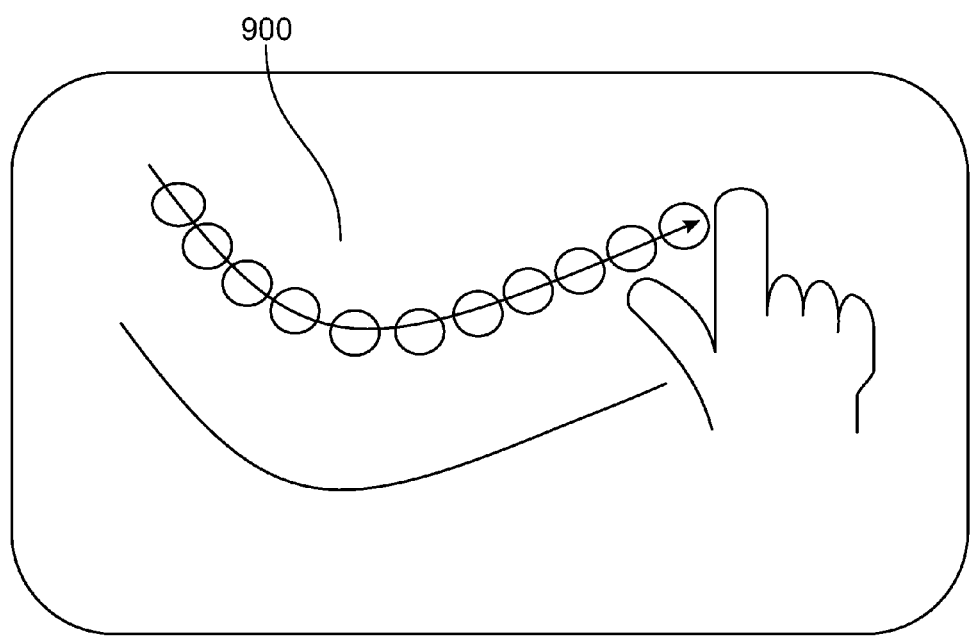
FIG. 9 illustrates an example path of a force applied to the sensor of FIG. 1.

In addition to the tap and hold, a swipe may be defined as a force applied over a zone of the sensor (as opposed to a single location), and the hold may be correlated with a control message allowing a user to control a system feature. As discussed above, it may be possible to measure the position and magnitude of the applied force, and by storing the measured position and magnitude, it may be possible to calculate the time-based change in the position and magnitude of the applied force. Accordingly, it may be possible to determine the path (or contour) of the applied force. An example path 900 is shown in FIG. 9. In some implementations, the zone of the sensor may be defined as encompassing a plurality of pressure sensitive areas that include one or more pressure sensing units, and the swipe may be defined as applying a force across the plurality of pressure sensitive areas of the sensor. The path may be linear, curved, radial, or take any other form. Similarly to the tap and hold, the swipe may be defined as application of any magnitude of force. Alternatively, in order to increase the number of control functions, swipes can be divided into discrete force threshold levels, each different threshold level being associated with a different control function. Optionally, swipes can also be divided into discrete time increments (e.g., T1>1.2 seconds, T2=0.6 seconds, T3=0.4 seconds) to increase the number of control functions. Although three discrete force threshold levels and time increments are shown in FIGS. 7B-7C, there may be more or less discrete force threshold levels and time increments.

FIGS. 7B-7C show example gesture combinations. For example, FIG. 7B shows an example tap and swipe combination table. In the table, the taps and swipes are each divided into three discrete pressure threshold levels, and the swipes are divided into three discrete time intervals. Accordingly, in FIG. 7B, there are 27 (=$3^3$) different combinations, and the different combinations may be associated with different control messages. In addition, FIG. 7C shows an example tap, hold and swipe combination table. Similarly to FIG. 7B, the taps and swipes are each divided into three discrete pressure threshold levels, and the swipes are divided into three discrete time intervals. Additionally, the holds are divided into three discrete pressure threshold levels. Accordingly, in FIG. 7C, there are 81 (=$3^4$) different combinations, and the different combinations may be associated with different control messages.

Figure 10:
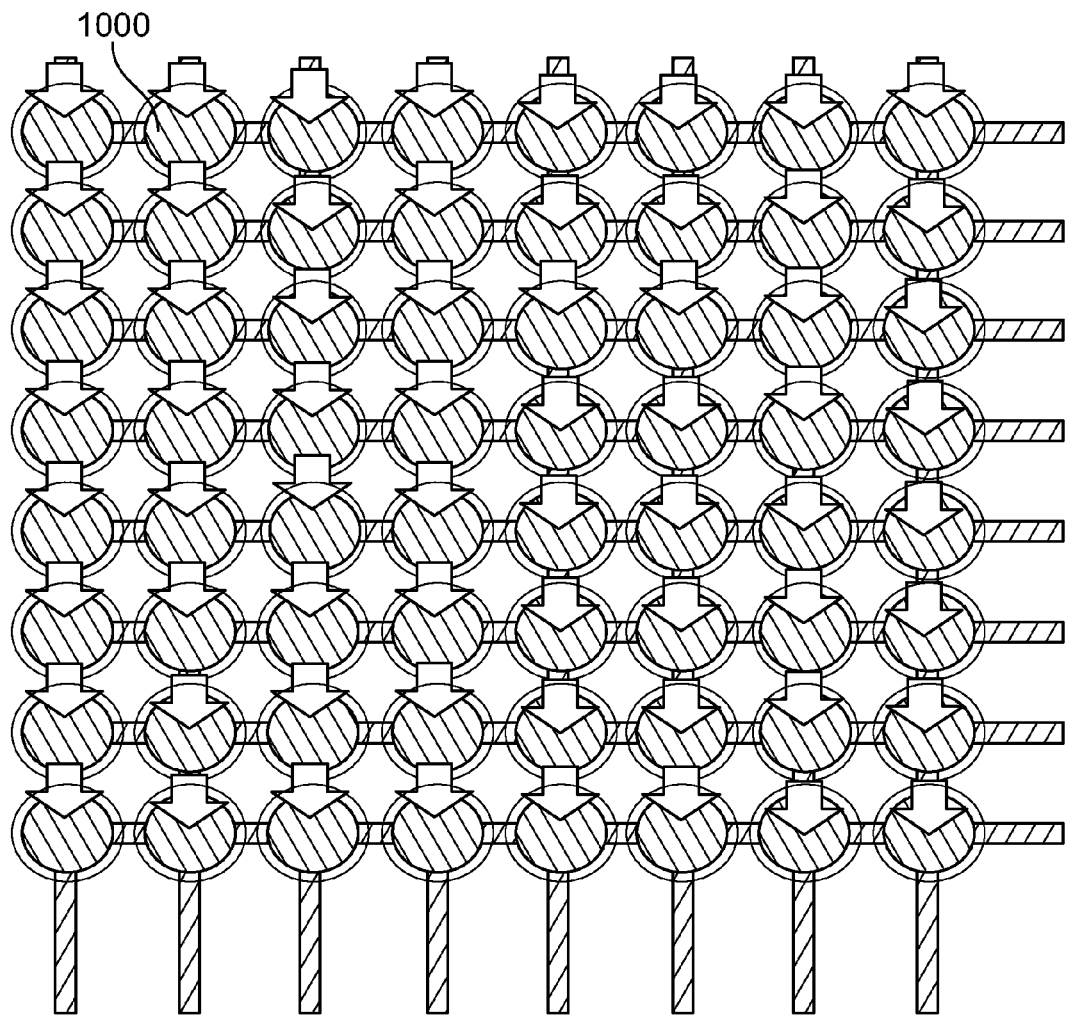
FIG. 10 illustrates a pressure sensor including a plurality of pressure sensing units.

Referring to FIG. 10, a sensor having a plurality of pressure sensing units 1000 is shown. The sensor of FIG. 10 may include a plurality of pressure sensing units 1000 arranged in a grid-like pattern, each pressure sensing unit being spaced from adjacent pressure sensing units. The pressure sensing units 1000 may be arranged at fixed or variable intervals. In addition, each pressure sensing unit may be configured as discussed above with regard to FIGS. 2A-2B, 3A, 4A and/or 5A.

Figure 11A:
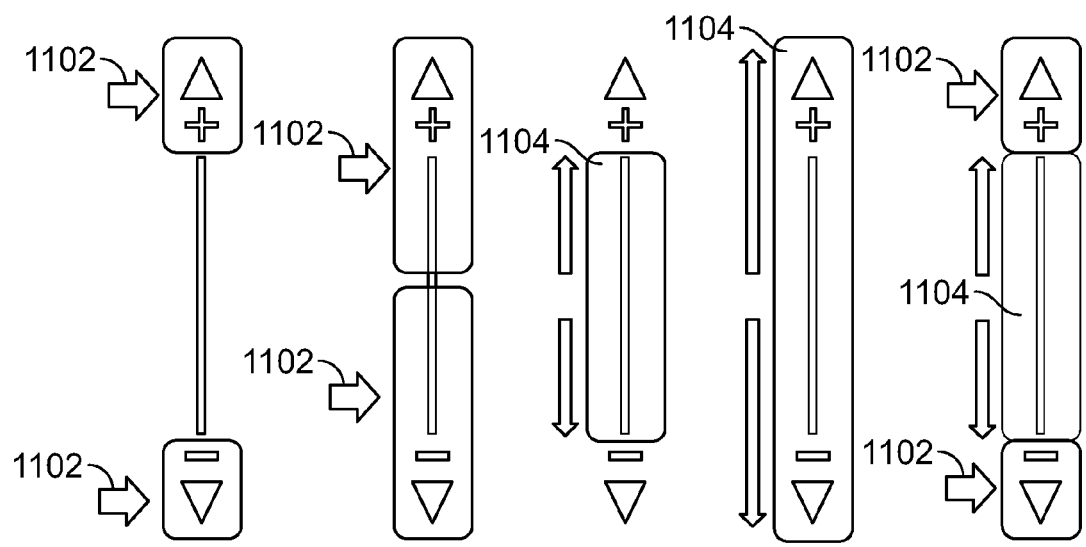
FIGS. 11A-11B illustrate example pressure sensors having zones according to implementations of the invention.
Figure 11B:
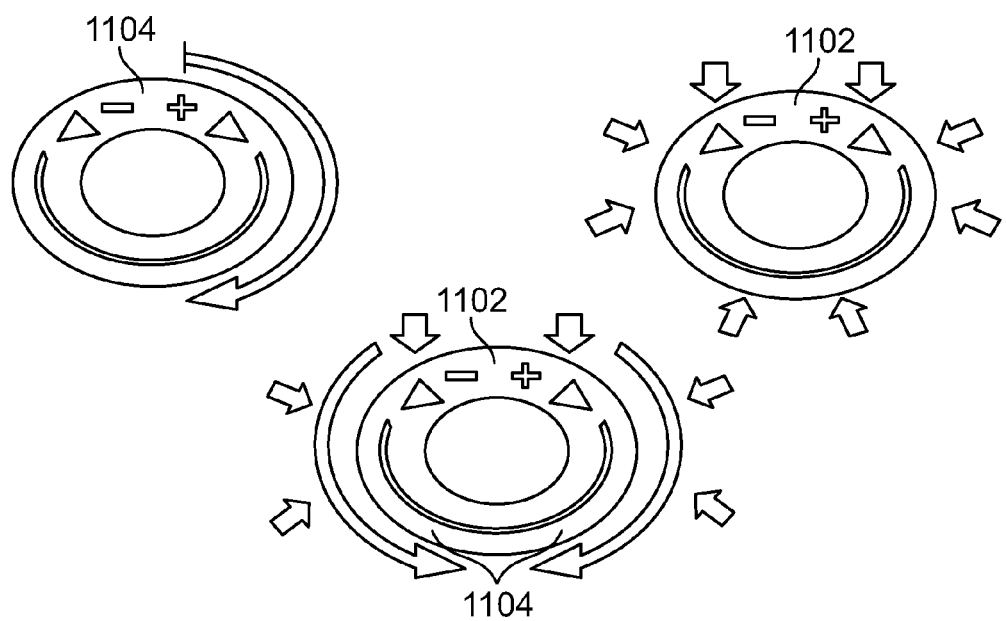

Referring to FIGS. 11A-11B, linear and radial sensor configurations are shown. For example, FIG. 11A shows five example sensor configurations including strip-like linear zones 1102 and 1104. In addition, FIG. 11B shows three example sensor configurations including strip-like radial zones. Zones 1102 may be configured as tap and/or hold zones, and zones 1104 may be configured as swipe zones, for example. Each zone 1102 and 1104 may be configured to include one or more pressure sensing units.

Figure 12A:
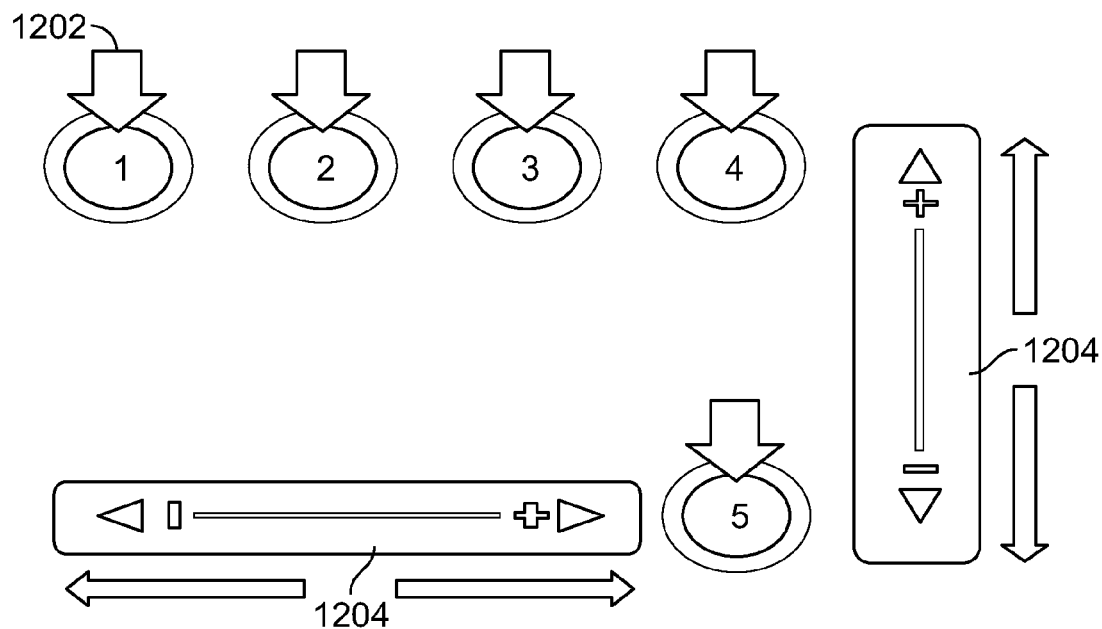
FIGS. 12A-12B illustrate additional example pressure sensors having zones according to implementations of the invention.
Figure 12B:
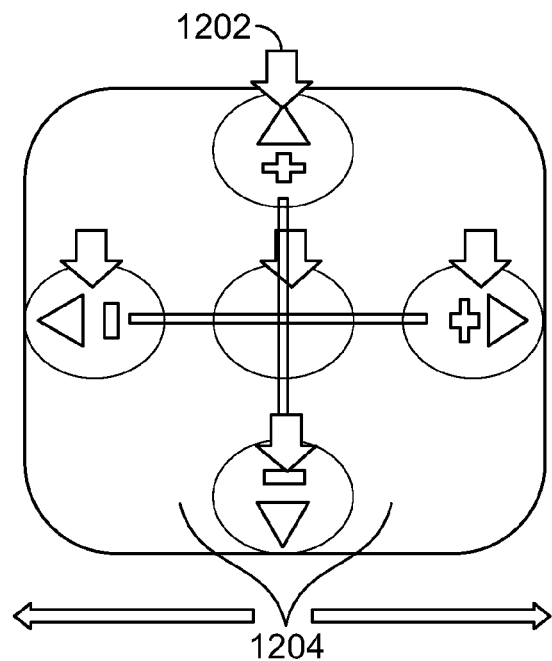

Referring to FIGS. 12A-12B, sensor configurations according to other implementations of the invention are shown. For example, FIG. 12A illustrates an example U-shaped sensor configuration. For example, zones 1202 may be configured as tap and/or hold zones. In this configuration, the zones 1202 may define operation buttons. In addition, zones 1204 may be configured as swipe zones. Further, FIG. 12B shows an example sensor including zones 1202 configured as tap and/or hold zones, which may define operation buttons, and zones 1204 configured as swipe zones. In this example configuration, zones 1202, 1204 are overlapping. Each zone 1202 and 1204 may be configured to include one or more pressure sensing units.

FIGS. 10, 11A-11B and 12A-12B are only example sensor configurations including a plurality of zones, and other sensor configurations may be possible. The sensors may be designed to include a variety of zones, where each zone may be configured as a tap, hold and/or swipe zone as needed to facilitate control of the systems. In addition, each zone may be configured to include one or more pressure sensing units. Further, each zone may be configured to detect the same or different magnitudes of applied force.

Figure 13A:
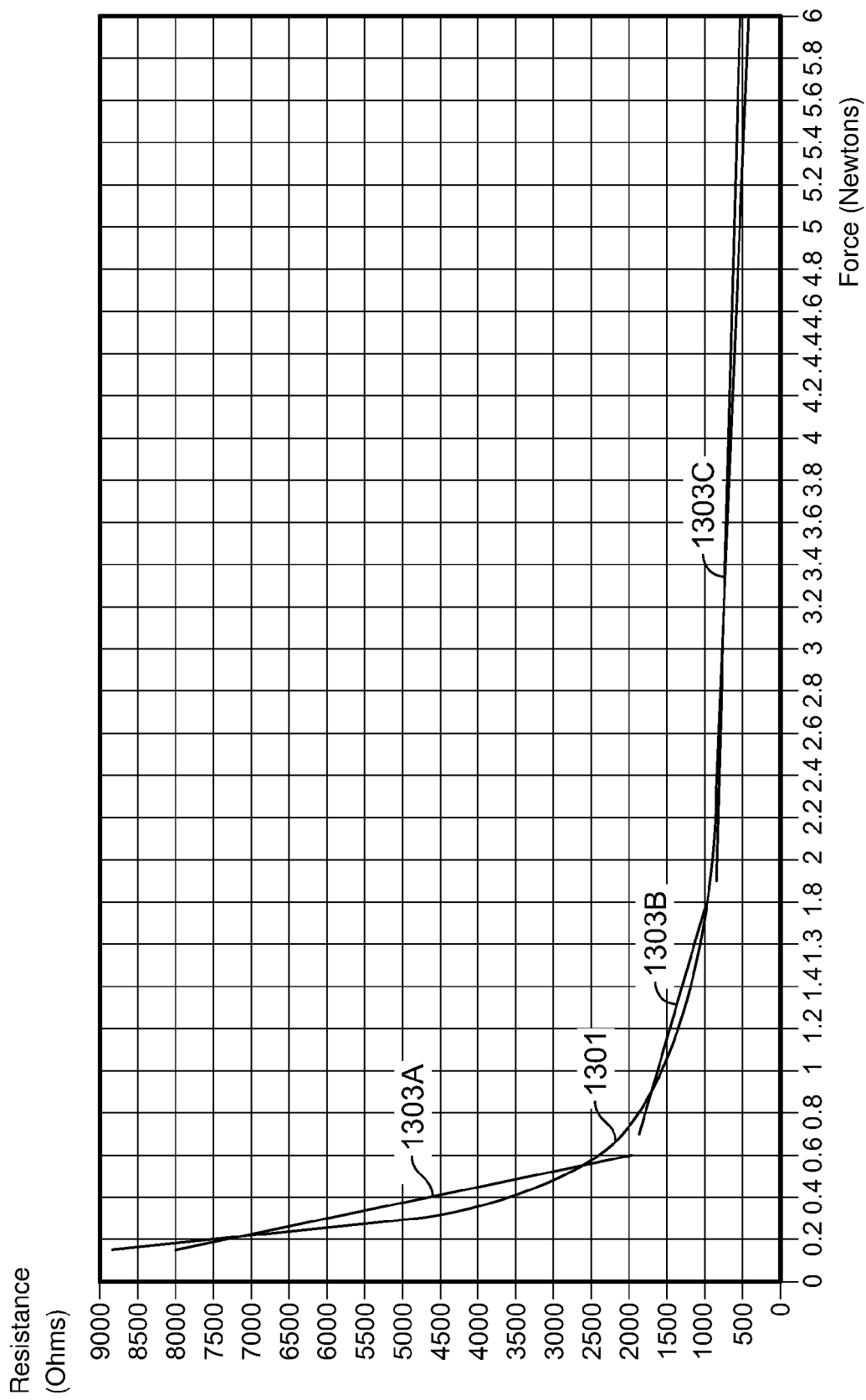
FIG. 13A illustrates an example average Resistance-Force response curve according to an implementation of the invention.

Referring now to FIG. 13A, an average Resistance-Force response curve 1301 according to an implementation of the invention is shown. The average Resistance-Force response curve 1301 illustrates the average response obtained during testing of a sensor according to implementations discussed herein. In FIG. 13A, lines 1303A, 1303B and 1303C estimate the sensitivity of the Resistance-Force response curve 1301 in first, second and third regions, respectively. For example, line 1303A estimates the sensitivity of the sensor in response to applied forces between 0 and 0.6N. Line 1303B estimates the sensitivity of the sensor in response to applied forces between 0.7 and 1.8N. Line 1303C estimates the sensitivity of the sensor in response to applied forces between 1.9 and 6N. In particular, the sensitivity of the sensor can be defined by Eqn. (1), below.

$$\text{Sensitivity} = \frac{\text{Sensor Value-Sensor Origin}}{\text{Force Value}} \quad (1)$$

In the first, second and third regions, the sensor origins are approximately 10.00 kΩ, 2.43 kΩ and 1.02 kΩ, respectively. Accordingly, the sensitivities of the sensor in the first, second and third regions are approximately −13,360 Ω/N, −799 Ω/N and −80 Ω/N, respectively.

Figure 13B:
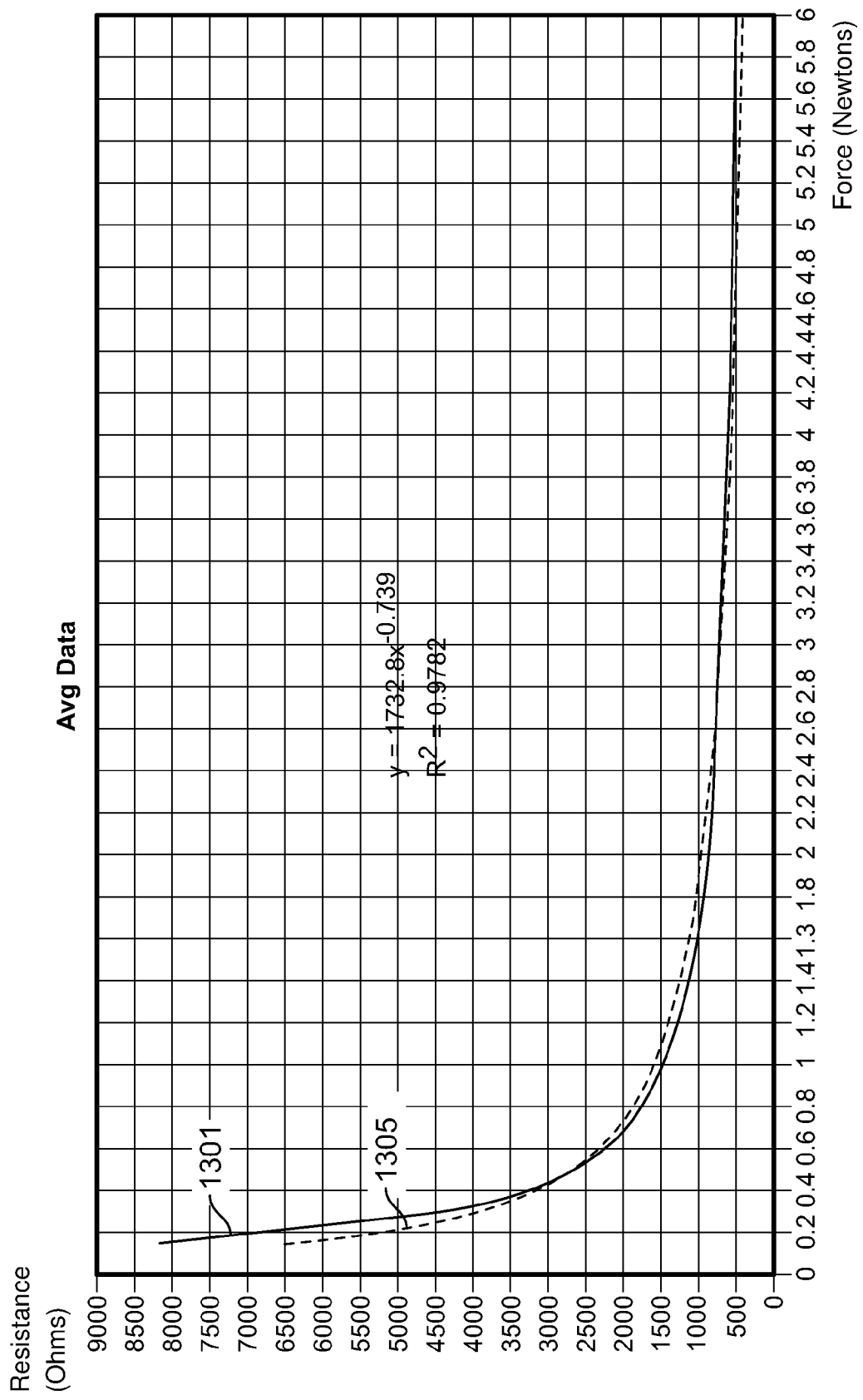
FIG. 13B illustrates an example power log function curve fitting the example average Resistance-Force response curve of FIG. 13A.
Figure 13C:
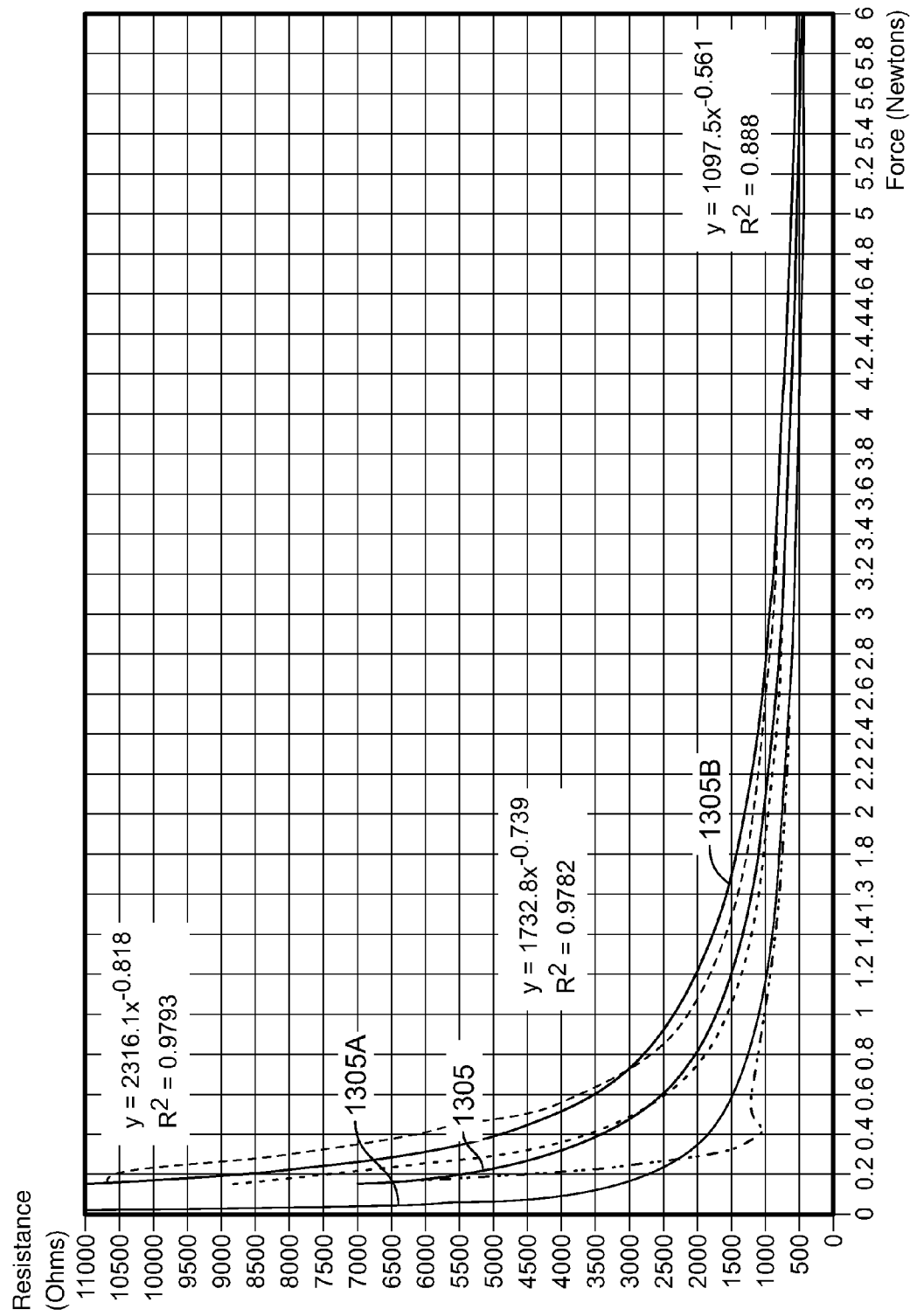
FIG. 13C illustrates example power log function curves fitting the three-sigma Resistance-Force response curves of FIG. 13A.

Referring now to FIGS. 13B and 13C, example power log function curves fitting the three-sigma Resistance-Force response curves of FIG. 13A are shown. For example, a power log function curve can be determined that fits the average response data obtained during testing of the sensor. The power log function curve can then be utilized to model or predict applied force values based on measured resistance values. FIGS. 13B and 13C show the power log function curve 1305 that fits the example average Resistance-Force response curve 1301. The power log function curve 1305 can be defined by Eqn. (2) below.

$$\text{Resistance} = 1732.8 * \text{Applied Force}^{-0.739} \quad (2)$$

The coefficient of determination ($R^2$) for the power log function curve 1305 is 0.9782. In addition, FIG. 13C shows example power log function curves fitting the three-sigma Resistance-Force response curve of FIG. 13A. Power log function curve 1305A fits the −3-sigma Resistance-Force response curve, and power log function curve 1305B fits the +3-sigma Resistance-Force response curve. Power log function curves 1305A and 1305B can be defined by Eqns. (3) and (4) below, respectively.

$$\text{Resistance} = 2316.1 * \text{Applied Force}^{-0.818} \quad (3)$$

$$\text{Resistance} = 1097.5 * \text{Applied Force}^{-0.561} \quad (4)$$

In addition, the coefficients of determination ($R^2$) for the power log function curves 1305A and 1305B are 0.9793 and 0.888, respectively.

It should be appreciated that the logical operations described herein with respect to the various figures may be implemented (1) as a sequence of computer implemented acts or program modules (i.e., software) running on a computing device, (2) as interconnected machine logic circuits or circuit modules (i.e., hardware) within the computing device and/or (3) a combination of software and hardware of the computing device. Thus, the logical operations discussed herein are not limited to any specific combination of hardware and software. The implementation is a matter of choice dependent on the performance and other requirements of the computing device. Accordingly, the logical operations described herein are referred to variously as operations, structural devices, acts, or modules. These operations, structural devices, acts and modules may be implemented in software, in firmware, in special purpose digital logic, and any combination thereof. It should also be appreciated that more or fewer operations may be performed than shown in the figures and described herein. These operations may also be performed in a different order than those described herein. In addition, when the logical operations described herein are implemented in software, the process may execute on any type of computing architecture or platform such as the sensor system 100 shown in FIG. 1.

Figure 14A:
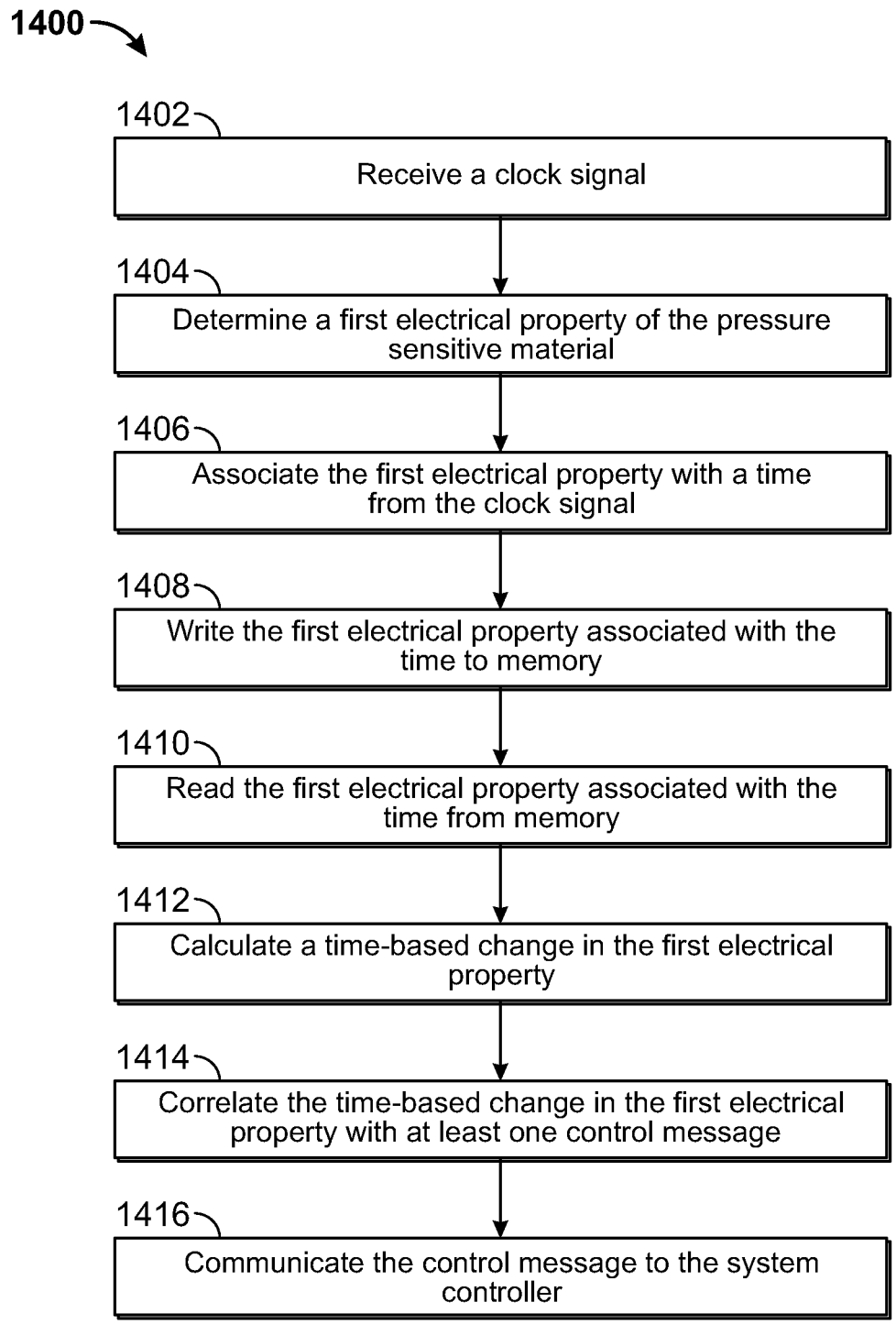
FIG. 14A-14F are flow diagrams illustrating example operations for sending a plurality of control messages to a system controller.

Referring now to FIG. 14A, a flow diagram 1400 illustrating example operations for sending a plurality of control messages to a system controller using a pressure sensitive material that at least partially intervenes between at least first and second conductors is shown. The first and second conductors can be the communication hardware discussed above with regard to FIGS. 1, 3A-3E and 4A-4D. At 1402, a clock signal is received from a system clock discussed above with regard to FIG. 1, for example. Then, at 1404, a first electrical property of the pressure sensitive material is determined. As discussed above, the pressure sensitive material can have a composition configured to continuously change at least the first electrical property, and the first electrical property can be determined using the first and second conductors. At 1406, the first electrical property can be associated with a time from the clock signal.

At 1408, the first electrical property associated with the time can be written to memory, and at 1410, the first electrical property associated with the time can be read from memory. After reading the first electrical property from memory, a time-based change of the first electrical property can be calculated at 1412. Thereafter, at 1414, the time-based change in the first electrical property can be correlated with at least one control message. At 1416, the control message can be communicated to the system controller.

Figure 14B:
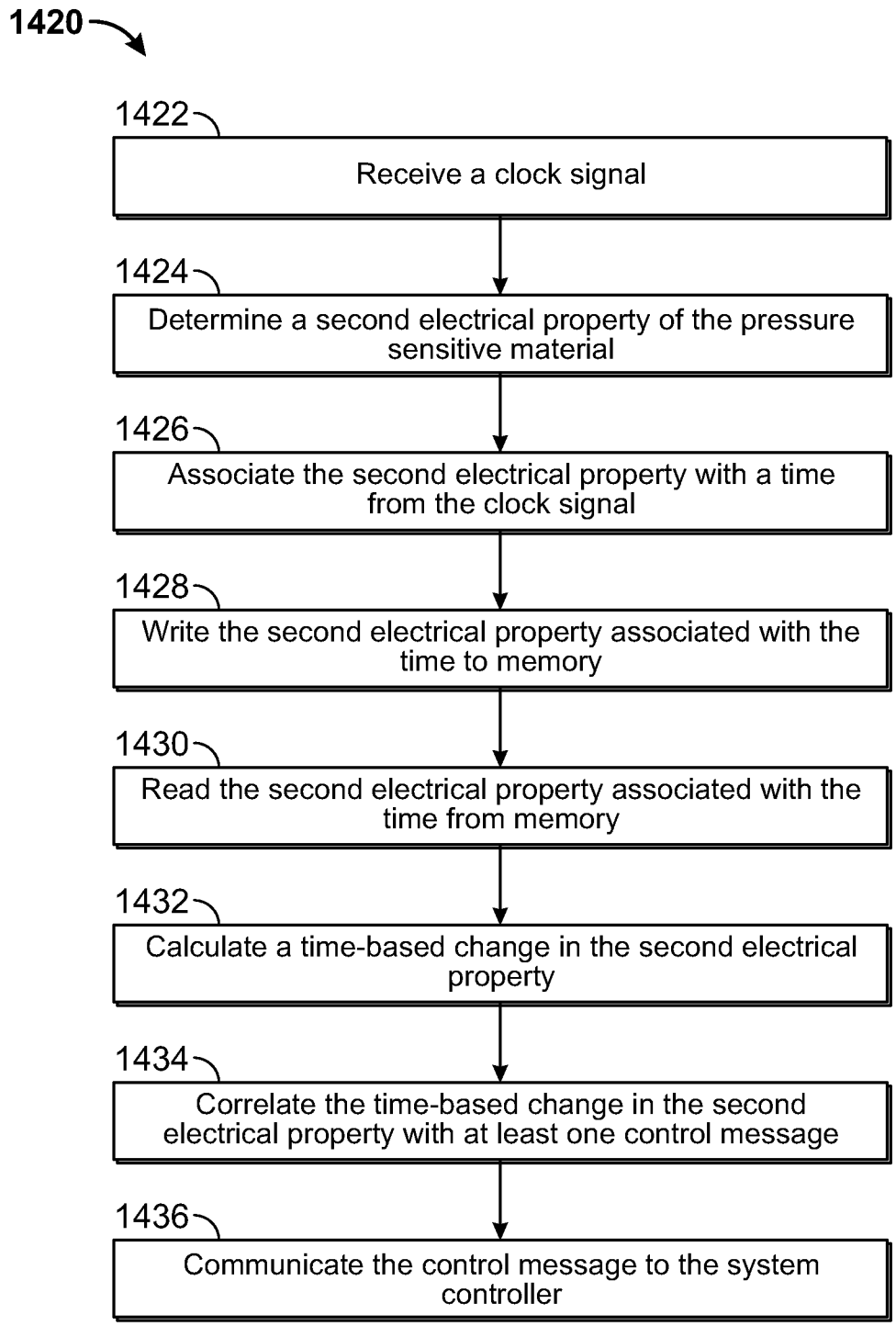
Figure 14C:
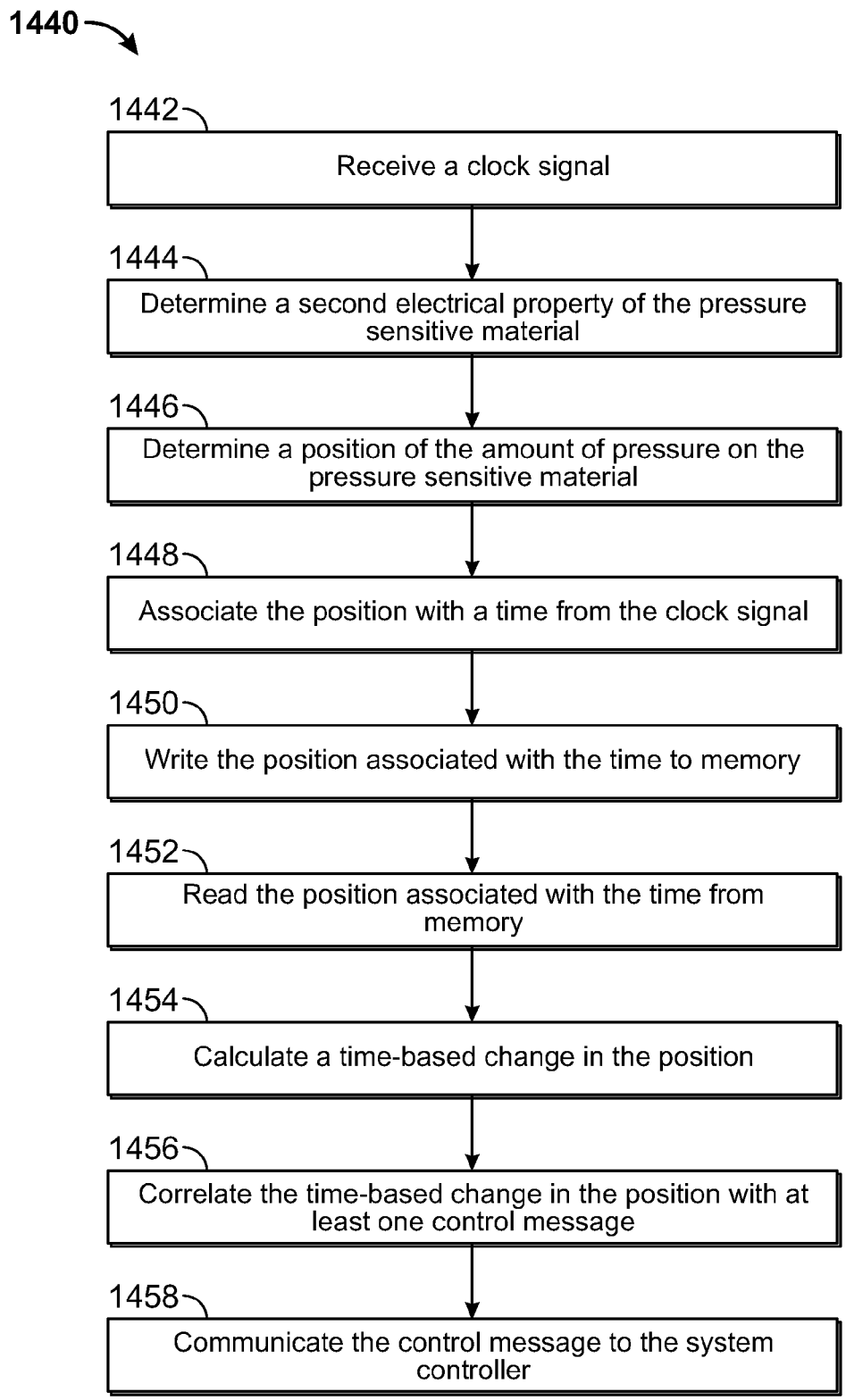
Figure 14D:
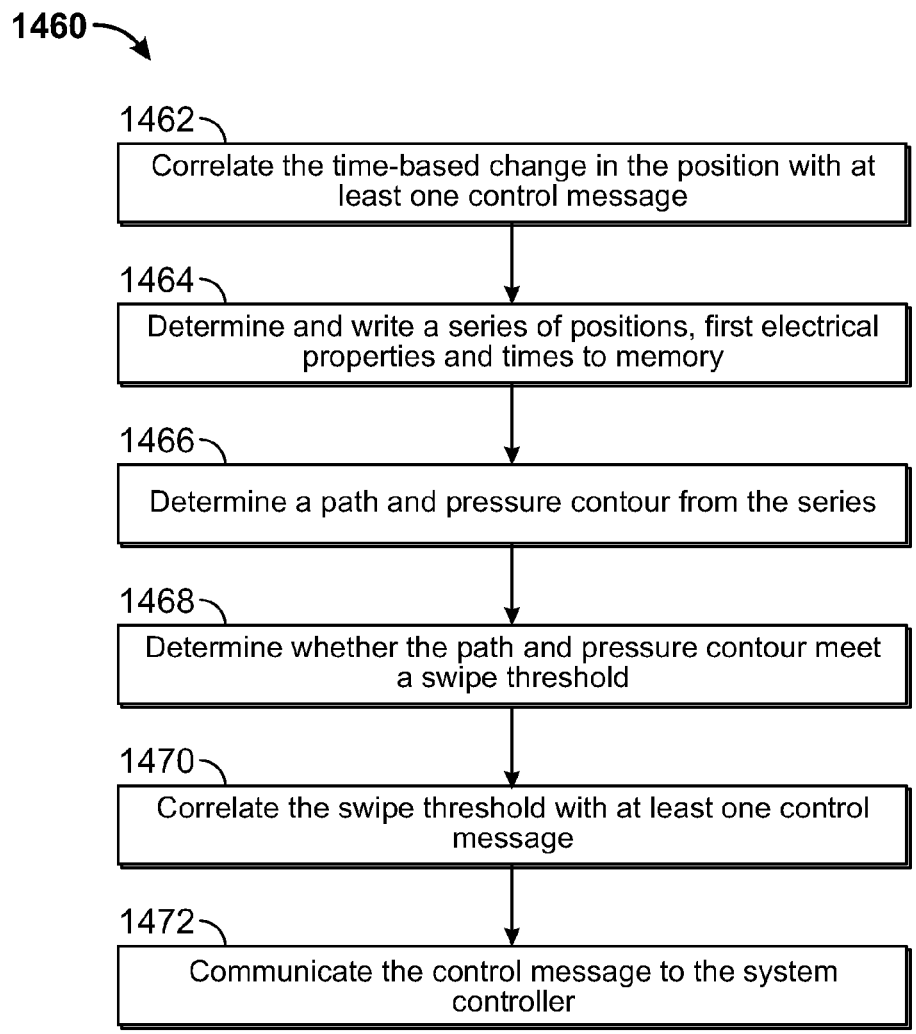
Figure 14E:
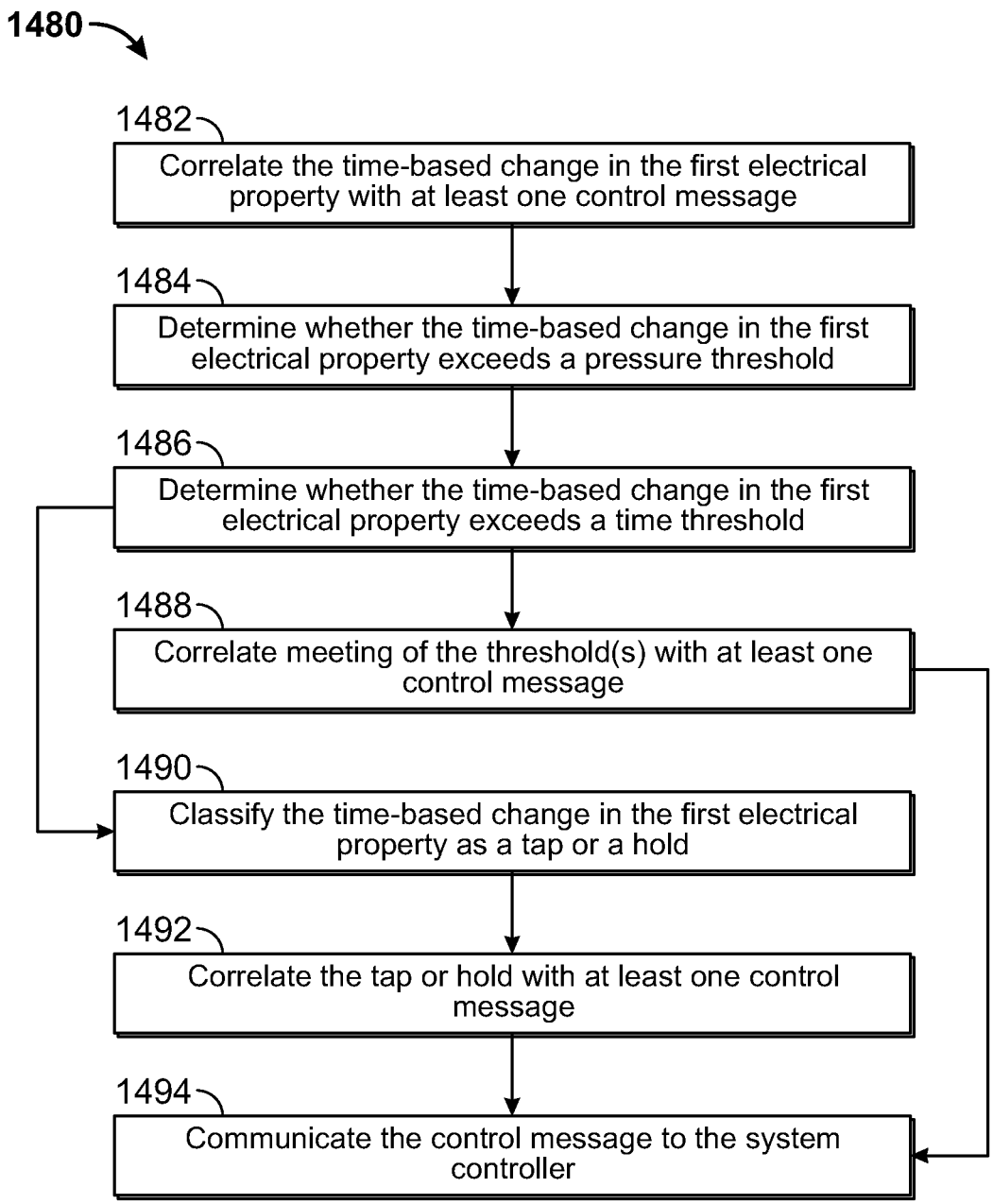

Referring now to FIG. 14E, a flow diagram 1480 illustrating example operations for correlating the time-based change in the first electrical property with at least one control message is shown. As discussed above, at 1482, it is possible to correlate the time-based change in the first electrical property with at least one control message. For example, at 1484, a determination can be made as to whether the time-based change in the first electrical property exceeds a pressure threshold. The determination can be made by comparing the measured magnitudes of the force applied to the pressure sensor during the period of time with a threshold. In some implementations, there can be a plurality of thresholds such as the plurality of discrete force threshold levels discussed above with regard to FIGS. 7A-7C. Additionally, at 1486, a determination can be made as to whether the time-based change in the first electrical property exceeds a time threshold. The determination can be made by comparing a time that force application to the pressure sensor begins with a time that force application to the pressure sensor ends, for example. Then, at 1488, meeting of one or both of the thresholds can be correlated with at least one control message. At 1494, the control message can be communicated to the system controller.

Alternatively or additionally, after determining whether the time-based change in the first electrical property exceeds the pressure threshold and/or the time threshold, the time-based change in the first electrical property can be classified as either a tap or a hold at 1490. For example, if the time-based change in the first electrical property exceeds the time threshold, it can be classified as a hold. Whereas, if the time-based change in the first electrical property does not exceed the time threshold, it can be classified as a tap. Additionally, as discussed above, there can be a plurality of thresholds such as the plurality of discrete force threshold levels in some implementations. At 1492, the tab or the hold can be correlated with at least one control message. At 1494, the control message can be communicated to the system controller.

In addition to measuring and analyzing the time-based change in the first electrical property of the pressure sensitive material, it is also possible to measure and analyze the time-based change in a second electrical property of the pressure sensitive material. Referring now to FIG. 14B, a flow diagram 1420 illustrating example operations for sending a plurality of control messages to a system controller using a pressure sensitive material that at least partially intervenes between pairs of the first conductor, the second conductor and a third conductor is shown. The first, second and third conductors can be the communication hardware discussed above with regard to FIGS. 1, 3A-3E and 4A-4D. At 1422, a clock signal is received from a system clock discussed above with regard to FIG. 1, for example. Then, at 1424, a second electrical property of the pressure sensitive material is determined using the third conductor, for example. As discussed above, the pressure sensitive material can have a composition configured to continuously change at least one electrical property, and the second electrical property can be determined using pairs of the first, second and third conductors. At 1426, the second electrical property can be associated with a time from the clock signal.

At 1428, the second electrical property associated with the time can be written to memory, and at 1430, the second electrical property associated with the time can be read from memory. After reading the second electrical property from memory, a time-based change of the second electrical property can be calculated at 1432. Thereafter, at 1434, the time-based change in the second electrical property can be correlated with at least one control message. At 1436, the control message can be communicated to the system controller.

In addition to measuring and analyzing the time-based change in the first electrical property of the pressure sensitive material, it is also possible to measure and analyze the time-based change in a second electrical property of the pressure sensitive material. Referring now to FIG. 14C, a flow diagram 1440 illustrating example operations for sending a plurality of control messages to a system controller using a pressure sensitive material that at least partially intervenes between pairs of the first conductor, the second conductor, the third conductor and a fourth conductor is shown. The first, second, third and fourth conductors can be the communication hardware discussed above with regard to FIGS. 1, 3A-3E and 4A-4D. At 1442, a clock signal is received from a system clock discussed above with regard to FIG. 1, for example. Then, at 1444, a second electrical property of the pressure sensitive material is determined. As discussed above, the pressure sensitive material can have a composition configured to continuously change at least one electrical property, and the second electrical property can be determined using pairs of the first, second, third and fourth conductors. At 1446, a position of the amount of pressure on the pressure sensitive material can be determined using the first and second electrical properties. After determining the position of the amount of pressure, at 1448, the position can be associated with a time from the clock signal.

At 1450, the position associated with the time can be written to memory, and at 1452, the position associated with the time can be read from memory. After reading the position from memory, a time-based change in the position can be calculated at 1454. Thereafter, at 1456, the time-based change in the position can be correlated with at least one control message. At 1458, the control message can be communicated to the system controller.

Referring now to FIG. 14D, a flow diagram 1460 illustrating example operations for correlating the time-based change in the position with at least one control message is shown. As discussed above, at 1462, the time-based change in the position can be correlated with at least one control message. For example, at 1464, in order to correlate the time-based change in the position with at least one control message, a series of positions, first electrical properties and times can be written to memory. At 1466, a path and pressure contour from the series can be determined. For example, at 1468, it is possible to determine whether the path and pressure contour meet a swipe threshold. As discussed above, a swipe may be defined as the force applied over a zone of the sensor (as opposed to a single location). Similarly to taps and holds, swipes can be divided into discrete force threshold levels and/or discrete time increments in order increase the number of available control functions. Accordingly, at 1470, the swipe threshold can be correlated with at least one control message. At 1472, the control message can be communicated to the system controller.

Figure 14F:
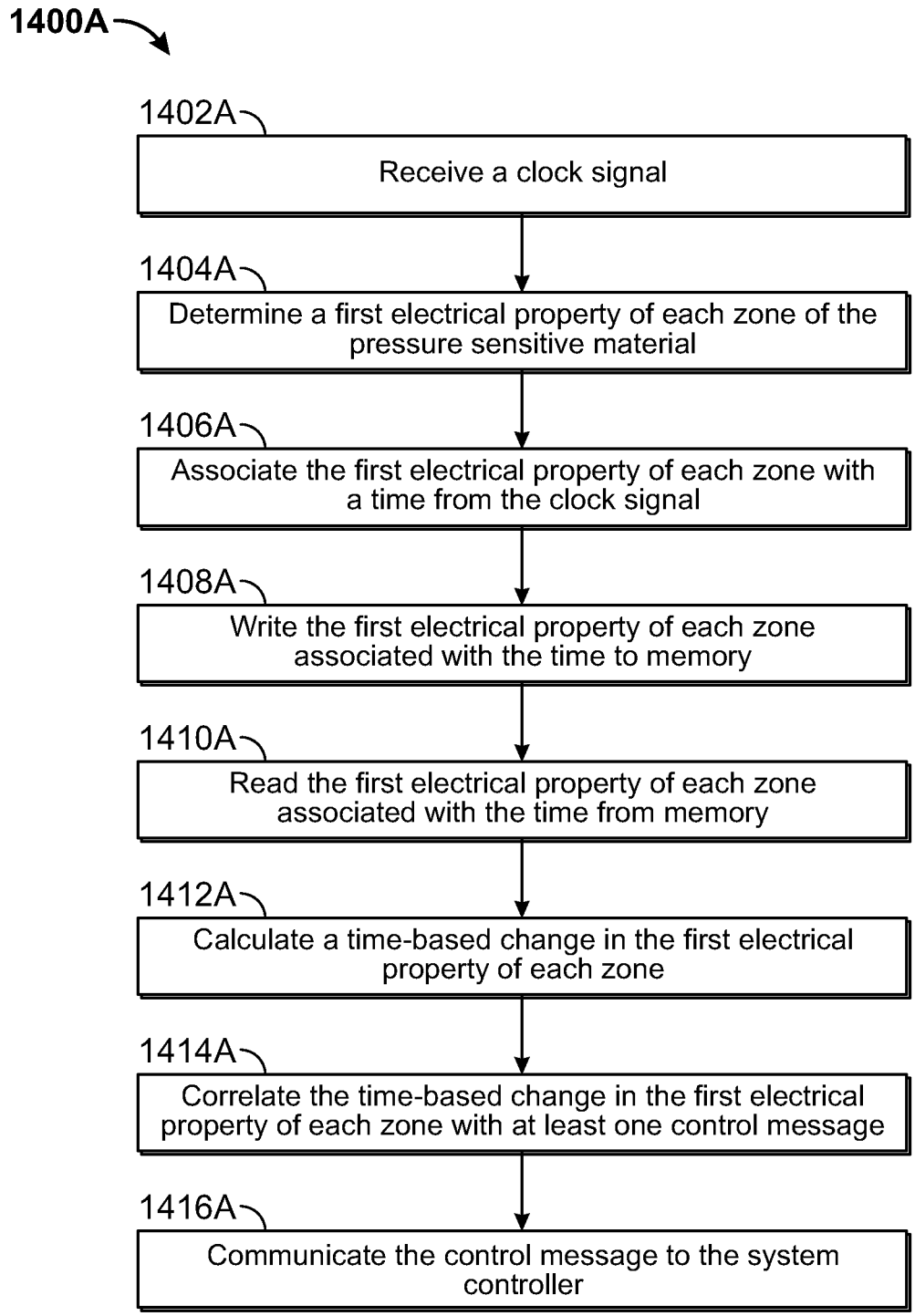

Referring now to FIG. 14F, a flow diagram 1400A illustrating example operations for sending a plurality of control messages to a system controller using a pressure sensitive material having a plurality of zones where each zone is connected to pairs of conductors is shown. The pairs of conductors can be the communication hardware discussed above with regard to FIGS. 1, 3A-3E and 4A-4D. At 1402A, a clock signal is received from a system clock discussed above with regard to FIG. 1, for example. Then, at 1404A, a first electrical property of each of the zones of the pressure sensitive material is determined. As discussed above, the pressure sensitive material can have a composition configured to continuously change at least the first electrical property, and the first electrical property can be determined using the pairs of conductors. At 1406A, the first electrical property of each of the zones can be associated with a time from the clock signal.

At 1408A, the first electrical property of each of the zones associated with the time can be written to memory, and at 1410A, the first electrical property of each of the zones associated with the time can be read from memory. After reading the first electrical property of each of the zones from memory, a time-based change of the first electrical property of each of the zones can be calculated at 1412A. Thereafter, at 1414A, the time-based change in the first electrical property of each of the zones can be correlated with at least one control message. At 1416A, the control message can be communicated to the system controller.

The example operations discussed above with regard to FIG. 14F allow the force applied to the zones of the pressure sensitive material to be detected. Optionally, the zones of the pressure sensitive material can be defined by separate portions of the pressure sensitive material. For example, by arranging the zones of the pressure sensitive material in different configurations, it is possible to detect the force applied to the pressure sensitive material over different portions of the pressure sensor. Thus, it is possible to detect the force applied over at least a portion of the zones that form a strip, a grid, a radius, a spaced array, buttons, or any other zone configuration, for example.

It should be understood that the various techniques described herein may be implemented in connection with hardware, firmware or software or, where appropriate, with a combination thereof. Thus, the methods and apparatuses of the presently disclosed subject matter, or certain aspects or portions thereof, may take the form of program code (i.e., instructions) embodied in tangible media, such as floppy diskettes, CD-ROMs, hard drives, or any other machine-readable storage medium wherein, when the program code is loaded into and executed by a machine, such as a computing device, the machine becomes an apparatus for practicing the presently disclosed subject matter. In the case of program code execution on programmable computers, the computing device generally includes a processor, a storage medium readable by the processor (including volatile and non-volatile memory and/or storage elements), at least one input device, and at least one output device. One or more programs may implement or utilize the processes described in connection with the presently disclosed subject matter, e.g., through the use of an application programming interface (API), reusable controls, or the like. Such programs may be implemented in a high level procedural or object-oriented programming language to communicate with a computer system. However, the program(s) can be implemented in assembly or machine language, if desired. In any case, the language may be a compiled or interpreted language and it may be combined with hardware implementations.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A pressure sensor for sending a plurality of control messages to a system controller, the pressure sensor comprising:
    a base;
    at least a first conductor and a second conductor;
    a pressure sensitive material supported by the base and at least partially intervening between the first and second conductors and having a composition configured to continuously change at least one electrical property of the pressure sensitive material in response to an applied force, wherein a conductive or electrical characteristic of the pressure sensor is configured to change based on a change in the at least one electrical property of the pressure sensitive material, and wherein the conductive or electrical characteristic of the pressure sensor is further configured to change based on a material, physical dimension, or arrangement of at least one of the first conductor, the second conductor, or the pressure sensitive material;
    a memory;
    a clock; and
    a processor connected in communication with the first and second conductors, the memory and the clock, the processor configured to determine a first electrical property of the pressure sensitive material using the first and second conductors and associate the first electrical property with a time from the clock and to write the first electrical property associated with the time to the memory;
    the processor further configured to read the first electrical property and the time from the memory and to calculate a time-based change in the first electrical property;
    the processor further configured to correlate the time-based change in the first electrical property with at least one of the control messages and to communicate the at least one of the control messages to the system controller, wherein the at least one electrical property is resistance, wherein resistance values of the pressure sensitive material define a predictable resistance-force response curve in response to varying amounts of applied force, and wherein the resistance values of the pressure sensitive material vary between $10^{12}\Omega \pm 10$ percent and $1\Omega \pm 10$ percent between 0 N and 10 N.

2. The pressure sensor of claim 1, wherein the at least one electrical property is continuously variable in relation to an amount of applied force.

3. The pressure sensor of claim 2, wherein the at least one electrical property is capable of changing in response to a change in the amount of applied force.

4. The pressure sensor of claim 1, wherein the predictable resistance-force response curve is defined by a power log function curve.

5. The pressure sensor of claim 4, wherein the power log function curve is Resistance=1732.8×Applied Force^−0.739.

6. The pressure sensor of claim 1, wherein a resistance value of the pressure sensitive material is 5 k$\Omega$±10 percent when the amount of applied force is 1 N and a resistance value of the pressure sensitive material is 1.5 k$\Omega$±10 percent when the amount of applied force is approximately 3 N.

7. The pressure sensor of claim 1, wherein the pressure sensitive material comprises a single contiguous layer at least partially intervening between the first and second conductors.

8. The pressure sensor of claim 1, further comprising a third conductor wherein the pressure sensitive material at least partially intervenes between pairs of the conductors.

9. The pressure sensor of claim 8, wherein the processor is connected in communication with the third conductor and is configured to determine a second electrical property using the third conductor.

10. The pressure sensor of claim 9, further comprising a fourth conductor, wherein the processor is connected in communication with the fourth conductor and is configured to determine the second electrical property using the fourth conductor.

11. The pressure sensor of claim 10, wherein the processor is further configured to determine a position of the amount of pressure on the pressure sensitive material using the first and second electrical properties.

12. The pressure sensor of claim 11, wherein the processor is further configured to associate the position with the time from the clock and to write the position associated with the time to the memory.

13. The pressure sensor of claim 12, wherein the processor is configured to read the position and the time from the memory and to calculate a time-based change to the position.

14. The pressure sensor of claim 13, wherein the processor is configured to correlate the time-based change in the position with the at least one of the control messages.

15. The pressure sensor of claim 14, wherein the processor is configured to determine and write to the memory a series of associated positions, first electrical properties and times to the memory.

16. The pressure sensor of claim 15, wherein the processor is configured to determine a path and pressure contour from the series.

17. The pressure sensor of claim 16, wherein the processor is further configured to determine whether the path and pressure contour meet a swipe threshold.

18. The pressure sensor of claim 17, wherein the processor is further configured to correlate the swipe threshold with the at least one of the control messages.

19. The pressure sensor of claim 1, wherein the processor is configured to determine whether the time-based change in the first electrical property exceeds a threshold associated with the amount of pressure.

20. The pressure sensor of claim 19, wherein the processor is configured to determine whether a time comparison between the time from the memory and a second time meets a time threshold.

21. The pressure sensor of claim 20, wherein the processor is configured to use meeting of the pressure and time thresholds as preconditions to communication of the at least one of the control messages.

22. The pressure sensor of claim 21, wherein the processor is further configured to correlate meeting of the thresholds with at least one of the control messages.

23. The pressure sensor of claim 20, wherein the processor is further configured to classify the time-based change as a tap if the time comparison is less than the time threshold and to classify the time-based change as a hold if the time comparison is more than the time threshold.

24. The pressure sensor of claim 23, wherein the processor is further configured to correlate whether the time-based change is the tap or the hold with the at least one of the control messages.

25. The pressure sensor of claim 1, wherein the pressure sensitive material has a plurality of zones and each of the zones is connected to a pair of conductors.

26. The pressure sensor of claim 25, wherein the processor is connected to the pairs of conductors and configured to determine the first electrical property of each of the zones using the pairs of conductors.

27. The pressure sensor of claim 26, wherein the processor is further configured to associate the first electrical property and to write the first electrical property associated with each of the zones to the memory.

28. The pressure sensor of claim 27, wherein the processor is configured to read the first electrical property associated with each of the zones from memory and to calculate the time-based change in the first electrical property using the first electrical property associated with each of the zones.

29. The pressure sensor of claim 28, wherein the zones are defined by separate portions of the pressure sensitive material.

30. The pressure sensor of claim 28, wherein at least two of the zones overlap.

31. The pressure sensor of claim 29, wherein one or more of the zones form at least one of a strip, a grid, a radius, a spaced array and a button.

32. The pressure sensor of claim 28, further comprising a cover defining portions corresponding to the zones.

33. The pressure sensor of claim 32, wherein each of the cover portions includes indicia associated with at least one of the control messages.

34. The pressure sensor of claim 1, further comprising a force concentrator positioned against the pressure sensitive material.

35. The pressure sensor of claim 34, further comprising a cover, wherein the force concentrator is positioned between the cover and the pressure sensitive material.

* * * * *